(12) United States Patent
Ohki

(10) Patent No.: US 8,598,571 B2
(45) Date of Patent: Dec. 3, 2013

(54) METHOD OF MANUFACTURING A COMPOUND SEMICONDUCTOR DEVICE WITH COMPOUND SEMICONDUCTOR LAMINATION STRUCTURE

(75) Inventor: Toshihiro Ohki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 202 days.

(21) Appl. No.: 13/008,353

(22) Filed: Jan. 18, 2011

(65) Prior Publication Data

US 2011/0220965 A1  Sep. 15, 2011

(30) Foreign Application Priority Data

Mar. 9, 2010  (JP) .................................. 2010-52102

(51) Int. Cl.
  *H01L 29/08*  (2006.01)
(52) U.S. Cl.
  USPC ............................................. 257/40; 257/51
(58) Field of Classification Search
  USPC ........................................... 257/40, E51.028
  See application file for complete search history.

(56) References Cited

U.S. PATENT DOCUMENTS

| 5,912,473 | A  | * | 6/1999 | Wakita et al. | .................... 257/40 |
| 6,864,118 | B2 | * | 3/2005 | Stasiak | ............................ 438/99 |
| 7,521,710 | B2 | * | 4/2009 | Nakamura et al. | ............... 257/40 |
| 2007/0278490 | A1 | * | 12/2007 | Hirao et al. | ...................... 257/64 |
| 2011/0220965 | A1 | * | 9/2011 | Ohki | ............................. 257/194 |

FOREIGN PATENT DOCUMENTS

JP  2002-359256 A1  12/2002

* cited by examiner

*Primary Examiner* — Howard Weiss
*Assistant Examiner* — Steven Rao
(74) *Attorney, Agent, or Firm* — Kratz, Quintos & Hanson, LLP

(57) ABSTRACT

A method of manufacturing a compound semiconductor device, includes: forming a compound semiconductor lamination structure over a substrate; forming a metal film over the compound semiconductor lamination structure; forming a source electrode and a drain electrode over the metal film; forming one of a metal oxide film and a metal nitride film by one of oxidizing and nitriding a part of the metal film; and forming a gate electrode over the metal oxide film or the metal nitride film.

18 Claims, 28 Drawing Sheets

US 8,598,571 B2

METHOD OF MANUFACTURING A COMPOUND SEMICONDUCTOR DEVICE WITH COMPOUND SEMICONDUCTOR LAMINATION STRUCTURE

CROSS-REFERENCE TO RELATED APPLICATIONS

This application is based upon and claims the benefit of priority of the prior Japanese Patent Application No. 2010-052105, filed on Mar. 9, 2010, the entire contents of which are incorporated herein by reference.

FIELD

The present invention relates to a compound semiconductor device and a method of manufacturing the same.

BACKGROUND

A semiconductor device including a compound semiconductor represented by GaN, AlN, InN, or mixed crystal thereof is popular as a high-power electronic device or a short-wavelength emission device since the semiconductor device has excellent material characteristics.

As a high-power electronic device, research and development of a field-effect transistor (FET) (particularly, a high electron mobility transistor (HEMT)) is in progress. Therefore, an application of such a high-power high-efficiency amplifier or a large-power switching device is expected to be implemented.

An example of the related art is disclosed in Japanese Unexamined Patent Application Publication No. 2002-359256.

SUMMARY

According to an aspect of the invention, a method of manufacturing a compound semiconductor device, includes: forming a compound semiconductor lamination structure over a substrate; forming a metal film over the compound semiconductor lamination structure; forming a source electrode and a drain electrode over the metal film; forming one of a metal oxide film and a metal nitride film by one of oxidizing and nitriding a part of the metal film; and forming a gate electrode over the metal oxide film or the metal nitride film.

According to another aspect of the invention, a compound semiconductor device, includes: a nitride semiconductor lamination structure formed over a substrate; a metal film formed over the nitride semiconductor lamination structure; one of a metal oxide film and a metal nitride film formed over the nitride semiconductor lamination structure; a source electrode and a drain electrode formed over the metal film; and a gate electrode formed over the metal oxide film or the metal nitride film, wherein the metal film and the metal oxide film or the metal nitride film contain the same metal element.

The object and advantages of the invention will be realized and attained by the elements, features, and combinations thereof particularly pointed out in the claims.

It is to be understood that both the foregoing general description and the following detailed description are exemplary and explanatory and are not restrictive of the invention, as claimed.

DESCRIPTION OF EMBODIMENTS

When a compound semiconductor device is manufactured by forming a source electrode, a drain electrode, and a gate electrode over a compound semiconductor lamination structure, the source and drain electrodes (ohmic electrodes) are formed in a process different from a process in which the gate electrode is formed. This is because different metals are used for forming the source and drain electrodes and for forming the gate electrode.

In this case, it is difficult to form a good semiconductor/metal interface with no residue in any of the semiconductor/metal interfaces of the interfaces between the compound semiconductor lamination structure and the source and drain electrodes and the interface between the compound semiconductor lamination structure and the gate electrode.

For example, when the source electrode and the drain electrode are formed and thereafter the gate electrode is formed, the electrodes are formed in accordance with the following process flow.

Figure 8A:
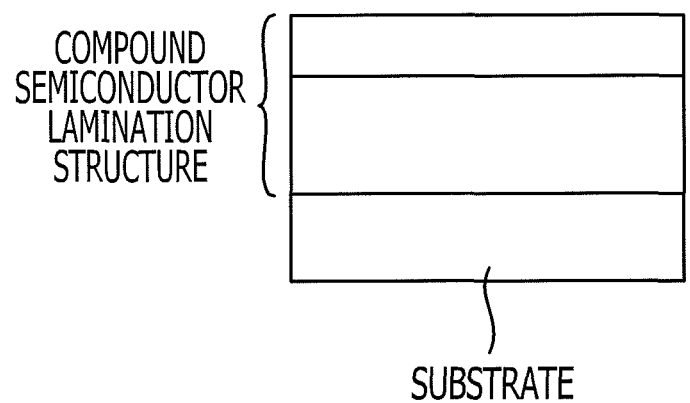
FIGS. 8A to 8D are schematic sectional views for explaining problems relating to the invention.

For example, as illustrated in FIG. 8A, a compound semiconductor lamination structure is formed over a substrate.

Figure 8B:
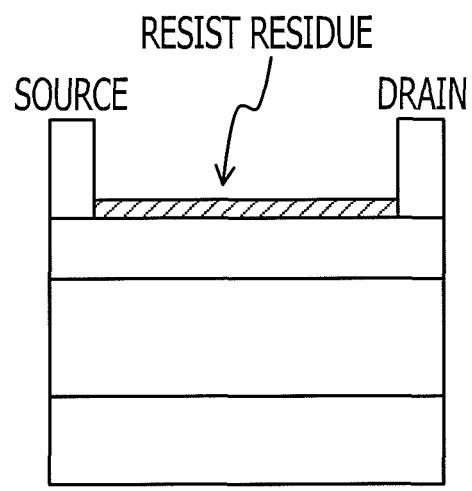

As illustrated in FIG. 8B, a source electrode and a drain electrode are formed over the compound semiconductor lamination structure.

Figure 8C:
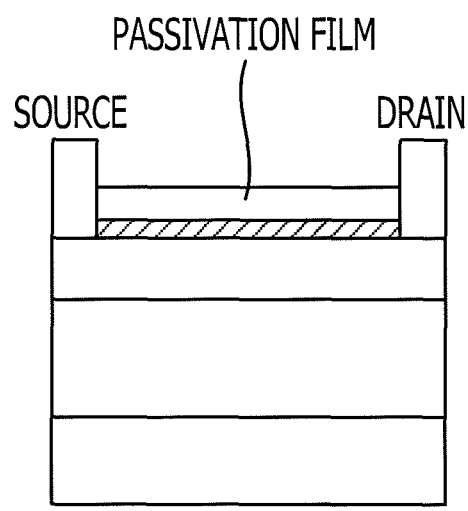

As illustrated in FIG. 8C, a passivation film is formed to cover the surface of the compound semiconductor lamination structure.

The source electrode and the drain electrode are formed using a resist. Therefore, when the source electrode and the drain electrode are formed, resist residue is attached on the surface of the compound semiconductor lamination structure including a gate electrode formation-scheduled region.

Figure 8D:
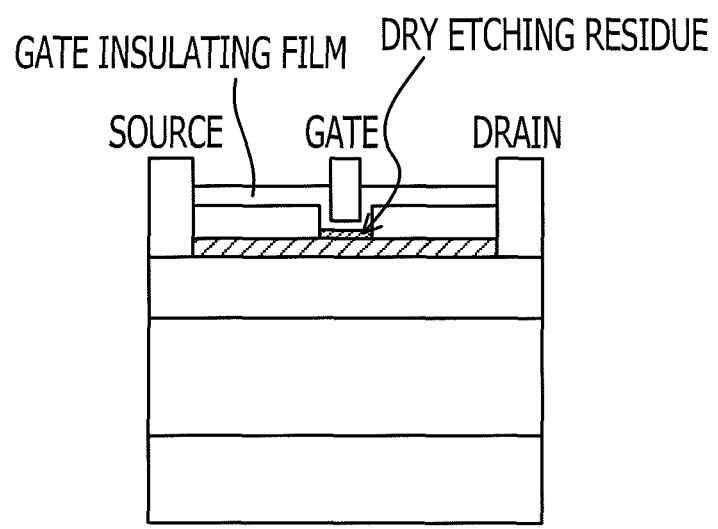

Next, the passivation film in the gate electrode formation-scheduled region is removed by dry etching, and then a gate insulation film is formed, as illustrated in FIG. 8D.

Then, as illustrated in FIG. 8D, the gate electrode is formed over the gate insulation film.

The resist residue when the source electrode and the drain electrode are formed and dry etching residue when the passivation film is subjected to dry etching may be found even when a removal process (cleaning process) (such as, organic processing) is performed. In particular, since it is difficult to remove the residue of the resist at an atomic level of the resist subjected to post baking, dry etching, or the like, resist residue or dry etching residue may still be detected after a removal process (such as, organic processing).

The resist residue or the like may be removed by acid treatment using, for example, a sulfuric acid hydrogen peroxide mixture. However, when the source electrode and the drain electrode are formed and then the gate electrode is formed, the source and drain electrodes may be damaged in acid processing performed when the subsequent gate electrode is formed. Therefore, it is not desirable to perform the acid processing when the removal process is performed to remove the resist residue.

Thus, it is difficult to sufficiently clean the resist residue when the source electrode and the drain electrode are formed and the dry etching residue when the passivation film is subjected to the dry etching.

Accordingly, when the source electrode and the drain electrode are formed and then the gate electrode is formed, the resist residue or the dry etching residue may enter the lower portion of the subsequently formed gate electrode (that is, a semiconductor/metal interface), which undesirably affects the device characteristics.

The case where the source electrode and the drain electrode are formed and the gate electrode is then formed has hitherto been described, but the same is applied to a case where the gate electrode is formed and the source electrode and the drain electrode are then formed.

Hereinafter, a compound semiconductor device and a method of manufacturing the same according to embodiments will be described with reference to the drawings.

A compound semiconductor device and a method of manufacturing the same according to a first embodiment will be described in reference to FIGS. 1A to 1F.

The compound semiconductor device and the method of manufacturing the same according to the first embodiment is a metal insulator semiconductor (MIS) type transistor with a gate insulation film and a method of manufacturing the same.

Hereinafter, a field-effect transistor using a compound semiconductor and a method of manufacturing the same, for example, a gallium nitride high-electron-mobility transistor (GaN-HEMT) and a method of manufacturing the same will be described.

Figure 1A:
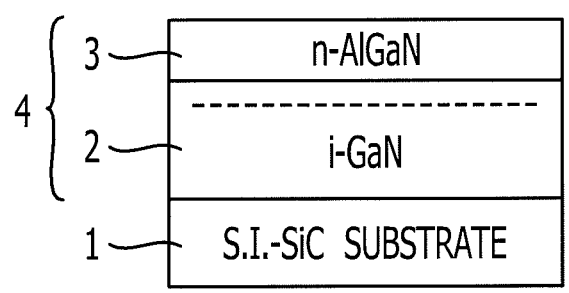
FIGS. 1A to 1F are schematic sectional views illustrating a compound semiconductor device and a method of manufacturing the same according to a first embodiment.

As illustrated in FIG. 1A, an i-GaN electron transit layer 2 and an n-AlGaN electron supply layer 3 are stacked over a semi-insulating SiC substrate 1 using, for example, a metal organic chemical vapor deposition (MOCVD) method to form a GaN-based semiconductor lamination structure 4.

The thickness of the i-GaN electron transit layer 2 is, for example, about 3 μm. The thickness of the n-AlGaN electron supply layer 3 is, for example, about 30 nm and a Si doping concentration is, for example, about $5\times10^{18}$ cm$^{-3}$. When an i-AlGaN spacer layer is provided, the thickness of the i-AlGaN spacer layer is, for example, about 5 nm.

The i-AlGaN spacer layer may be formed between the i-GaN electron transit layer 2 and the n-AlGaN electron supply layer 3, as necessary. The semi-insulating SiC substrate 1 is referred to as a semi-insulating (SI)-SiC substrate. The electron transit layer 2 is also referred to as a carrier transit layer. The electron supply layer 3 is also referred to as a carrier supply layer. The GaN-based semiconductor lamination structure 4 is also referred to as a nitride semiconductor lamination structure or a compound semiconductor lamination structure. The i-GaN electron transit layer 2 and the n-AlGaN electron supply layer 3 are also referred to as a plurality of compound semiconductor layers.

Next, the surface of the GaN-based semiconductor lamination structure 4 (that is, the surface of the AlGaN electron supply layer 3) is cleaned using, for example, an organic solvent or acid. For example, the surface of the AlGaN electron supply layer 3 is cleaned using, for example, a sulfuric acid hydrogen peroxide mixture (SPM).

Next, using, for example, a photolithography technique, resist openings are formed in a source electrode formation-scheduled region, a drain electrode formation-scheduled region, and a gate electrode formation-scheduled region, respectively, over the surface of the GaN-based semiconductor lamination structure 4 (that is, the surface of the AlGaN electron supply layer 3).

Figure 1B:
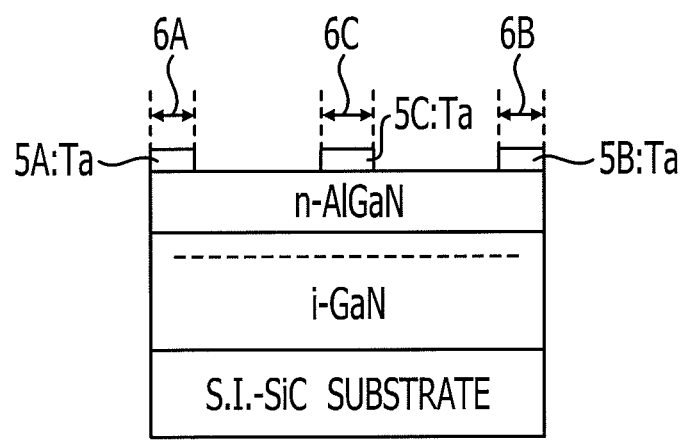

As illustrated in FIG. 1B, using the resist with the openings, Ta films (metal films) 5A to 5C with a thickness of, for example, about 20 nm are simultaneously formed over the surface of the GaN-based semiconductor lamination structure 4 by, for example, a deposition/lift-off technique. That is, the Ta films 5A to 5C are simultaneously formed in a source electrode formation-scheduled region 6A, a drain electrode formation-scheduled region 6B, and a gate electrode formation-scheduled region 6C, respectively, over the surface of the GaN-based semiconductor lamination structure 4. The source electrode formation-scheduled region 6A and the drain electrode formation-scheduled region 6B are distant from each other with the gate electrode formation-scheduled region 6C located therebetween.

The Ta films 5A to 5C with the thickness of about 5 nm to about 100 nm are preferably formed. More preferably, the thickness of the Ta films 5A to 5C is in the range of between about 10 nm and about 50 nm. The lower limit of the thickness of the Ta films 5A to 5C may be determined depending on an allowable range of voltage to be applied. The upper limit of the thickness of the Ta films 5A to 5C may be determined depending on an allowable range of transconductance.

Figure 1C:
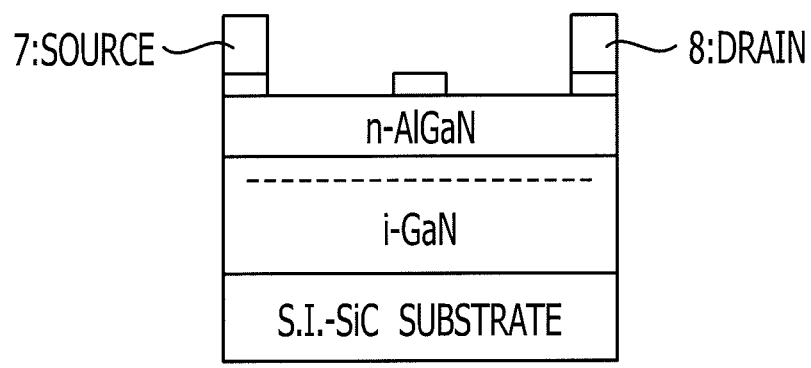

Next, as illustrated in FIG. 1C, a source electrode 7 and a drain electrode 8 are formed over the Ta films 5A and 5B, respectively.

First, the resist opening is formed in each of the Ta films 5A and 5B of the source electrode formation-scheduled region 6A and the drain electrode formation-scheduled region 6B using, for example, a photolithography technique, respectively.

For example, using the resists with the openings, Al layers with a thickness of, for example, about 200 nm are formed as the source electrode 7 and the drain electrode 8 in the source electrode formation-scheduled region 6A and the drain electrode formation-scheduled region 6B, respectively, by the deposition/lift-off technique.

Thus, the source electrode 7 formed by the Al layer is formed over the Ta film 5A formed in the source electrode formation-scheduled region 6A and the drain electrode 8 formed by the Al layer is formed over the Ta film 5B formed in the drain electrode formation-scheduled region 6B.

Figure 1D:
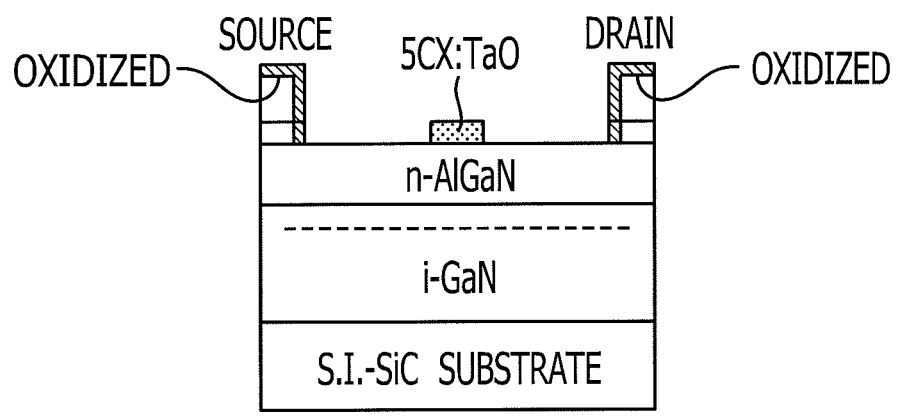

Thereafter, as illustrated in FIG. 1D, by performing heat treatment in an oxygen-containing atmosphere, the entire Ta film 5C of the gate electrode formation-scheduled region 6C is oxidized to form a TaO film 5CX. Here, the TaO film 5CX is an insulating metal oxide film and serves as a gate insulating film.

By this heat treatment, the upper surfaces and the side surfaces of the source electrode 7 and the drain electrode 8 and the side surfaces of the Ta films 5A and 5B in the lower portions of the source electrode 7 and the drain electrode 8 are simultaneously oxidized. By this heat treatment, the ohmic characteristics of the source electrode 7 and the drain electrode 8 respectively formed over the Ta films 5A and 5B are also ensured.

Thus, the TaO film 5CX serving as a gate insulating film is formed by oxidizing a part (here, the Ta film 5C of the gate electrode formation-scheduled region 6C) of the plurality of Ta films 5A to 5C formed over the surface of the GaN-based semiconductor lamination structure 4.

Figure 1E:
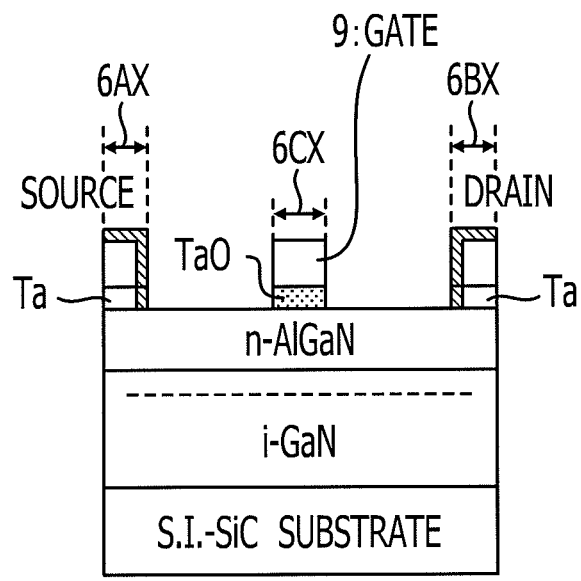

Next, as illustrated in FIG. 1E, a gate electrode 9 is formed over the TaO film 5CX.

A resist opening is first formed in the TaO film 5CX of the gate electrode formation-scheduled region 6C using, for example, a photolithography technique.

Using the resist with the opening, an Au layer with a thickness of, for example, about 500 nm is formed as the gate electrode 9 in the gate electrode formation-scheduled region 6C by, for example, a deposition/lift-off technique.

Thus, the gate electrode 9 formed by the Au layer is formed over the TaO film 5CX serving as the gate insulating film formed by oxidizing the Ta film 5C formed in the gate electrode formation-scheduled region 6C.

Here, since the gate electrode formation-scheduled region 6C is located between the source electrode formation-scheduled region 6A and the drain electrode formation-scheduled region 6B, the gate electrode 9 is formed between the source electrode 7 and the drain electrode 8. That is, since the source electrode formation-scheduled region 6A and the drain electrode formation-scheduled region 6B are distant from each other with the gate electrode formation-scheduled region 6C located therebetween, the source electrode 7 and the drain electrode 8 are formed at positions distant from each other with the gate electrode 9 formed therebetween.

Figure 1F:
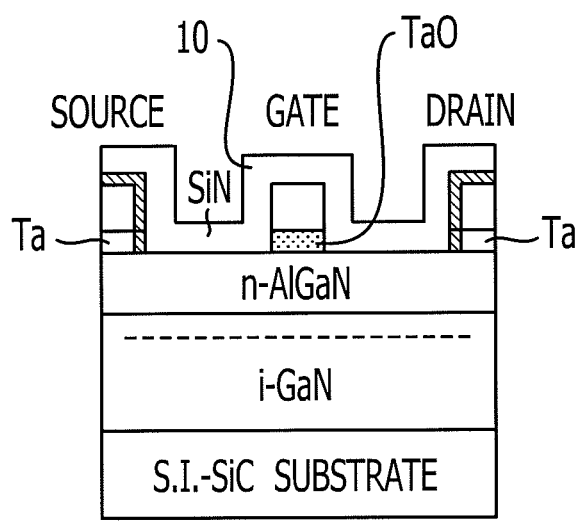

Next, as illustrated in FIG. 1F, a passivation film (insulating film) 10 including, for example, SiN is formed over the entire surface. After the gate electrode 9 is formed as described above, the passivation film 10 is formed to cover at least the surface of the GaN-based semiconductor lamination structure 4 (that is, the surface of the AlGaN electron supply layer 5).

Thus, the MIS type GaN-HEMT can be manufactured.

In this embodiment, the Ta films 5A between the GaN-based semiconductor lamination structure 4 and the source electrode 7, the Ta film 5B between the GaN-based semiconductor lamination structure 4 and the drain electrode 8, and the Ta film 5C used to form the TaO film 5CX between the GaN-based semiconductor lamination structure 4 and the gate electrode 9 are simultaneously formed. That is, the Ta film 5A contacting the lower portion of the source electrode 7 and contacting the surface of the GaN-based semiconductor lamination structure 4, the Ta film 5B contacting the lower portion of the drain electrode 8 and contacting the surface of the GaN-based semiconductor lamination structure 4, and the Ta film 5C, which is used to form the TaO film 5CX, contacting the lower portion of the gate electrode 9 and contacting the surface of the GaN-based semiconductor lamination structure 4 are simultaneously formed.

Thus, the lowermost layers (first layers) of the respective lamination structures, in a source electrode formation region 6AX, a drain electrode formation region 6BX, and a gate electrode formation region 6CX are formed simultaneously (that is, the layers (Ta films 5A to 5C) contacting the surface of the GaN-based semiconductor lamination structure 4) are simultaneously formed. In the lamination structures respectively formed in the source electrode formation region 6AX, the drain electrode formation region 6BX, and the gate electrode formation region 6CX, the lowermost layers may be simultaneously formed and the upper layers of the lowermost layers may be formed in different processes, as in the above-described manner.

In this case, the surface of the GaN-based semiconductor lamination structure 4 can be cleaned, before the lowermost layers of the lamination structures respectively formed in the source electrode formation region 6AX, the drain electrode formation region 6BX, and the gate electrode formation region 6CX are formed.

Therefore, the good semiconductor/metal interface with no residue can be obtained in any of the regions where the source electrode 7, the drain electrode 8, and the gate electrode 9 are formed.

Thus, good semiconductor/metal interfaces are obtained as the semiconductor/metal interfaces of the source electrode formation region 6AX and the drain electrode formation region 6BX, thereby reducing contact resistance. Moreover, since good semiconductor/metal interface is obtained as the semiconductor/metal interface of the gate electrode formation region 6CX, the interface level becomes small; and thus, a phenomenon caused by a trap of current collapse, a variation in a threshold value or the like is suppressed.

When the GaN-HEMT operates at high voltage, a very high electric field is applied near the gate electrode. However, even in such a case, the device characteristics can be prevented from deteriorating.

By simultaneously forming the lowermost layers of the lamination structures respectively formed in the source electrode formation region 6AX, the drain electrode formation region 6BX, and the gate electrode formation region 6CX, an alignment error between the source and drain electrodes 7 and 8 and the gate electrode 9 may not occur. Consequently, a device with uniform characteristics can be mass produced.

The MIS type GaN-HEMT manufactured in the above-described manner according to this embodiment has the following configuration.

As illustrated in FIG. 1F, the MIS type GaN-HEMT has the GaN-based semiconductor lamination structure 4, which includes the i-GaN electron transit layer 2 and the n-AlGaN electron supply layer 3, over the semi-insulating SiC substrate 1. That is, the MIS type GaN-HEMT has the GaN-based semiconductor lamination structure 4 including the AlGaN electron supply layer 3 in the uppermost layer.

The MIS type GaN-HEMT includes the Ta films 5A and 5B and the TaO film 5CX over the GaN-based semiconductor lamination structure 4.

The MIS type GaN-HEMT includes the source electrode 7 and the drain electrode 8 over the Ta films 5A and 5B, respectively.

The MIS type GaN-HEMT includes the gate electrode 9 over the TaO film 5CX. The TaO film 5CX formed immediately below the gate electrode 9 serves as the gate insulating layer.

In the MIS type GaN-HEMT, the Ta films 5A and 5B respectively formed below the source electrode 7 and the drain electrode 8 and the TaO film 5CX formed below the gate electrode 9 all contain Ta. That is, the metal layer 5A between the source electrode 7 and the GaN-based semiconductor lamination structure 4, the metal layer 5B between the drain electrode 8 and the GaN-based semiconductor lamination structure 4, and the insulating metal oxide film 5CX between the gate electrode 9 and the GaN-based semiconductor lamination structure 4 contain the same metal element (here, Ta).

The Ta films (metal layers) 5A and 5B are the first layers of the lamination structures in the source electrode formation region 6AX and the drain electrode formation region 6BX respectively and contact the surface of the GaN-based semiconductor lamination structure 4. The TaO film (an insulating metal oxide film; an insulating film) 5CX is the first layer of the lamination structure in the gate electrode formation region 6CX and contacts the surface of the GaN-based semiconductor lamination structure 4. That is, the first layers of the lamination structures in the source electrode formation region 6AX and the drain electrode formation region 6BX respectively contacting the surface of the GaN-based semiconductor lamination structure 4 and the first layer of the lamination structure in the gate electrode formation region 6CX contacting the surface of the GaN-based semiconductor lamination structure 4 contain the same metal element (here, Ta).

In the MIS type GaN-HEMT, the upper surfaces and the side surfaces of the source electrode 7 and the drain electrode 8 and the side surfaces of the Ta films 5A and 5B in the lower portions of the source electrode 7 and the drain electrode 8 are covered with the oxide film. The entire surface (at least, the surface of the GaN-based semiconductor lamination structure 4) is covered with the SiN passivation film 10.

Accordingly, in the compound semiconductor device and the method of manufacturing the same according to this embodiment, it is possible to implement the advantage of obtaining the good semiconductor/metal interface with no residue in any of the regions where the source electrode 7, the drain electrode 8, and the gate electrode 9 are formed.

A compound semiconductor device and a method of manufacturing similar to a second embodiment will be described in reference to FIGS. 2A to 2G.

The method of manufacturing the compound semiconductor device according to this embodiment is different from that according to the above-described first embodiment in that a process of forming the metal films 5A to 5C over the compound semiconductor lamination structure 4 is different and a process of forming the passivation film 10 to oxidize the metal films 5A to 5C is further included. In FIGS. 2A to 2G, the same reference numerals are given to the same constituents as those of the above-described first embodiment.

Figure 2A:
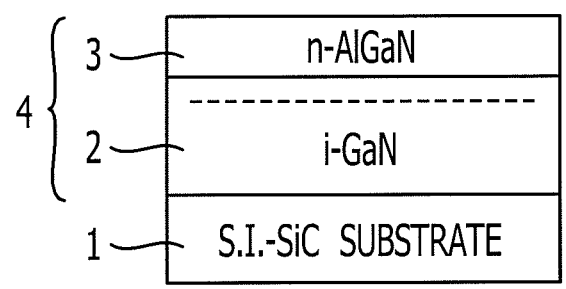
FIGS. 2A to 2G are schematic sectional views illustrating a compound semiconductor device and a method of manufacturing the same according to a second embodiment.

As illustrated in FIG. 2A, the i-GaN electron transit layer 2 and the n-AlGaN electron supply layer 3 are stacked over the semi-insulating SiC substrate 1 using, for example, the MOCVD method to form the GaN-based semiconductor lamination structure 4, as in the above-described first embodiment.

The surface of the GaN-based semiconductor lamination structure 4 (that is, the surface of the AlGaN electron supply layer 3) is cleaned using, for example, an organic solvent or acid, as in the first embodiment.

A Ta film with a thickness of, for example, about 20 nm is formed over the surface of the GaN-based semiconductor lamination structure 4 (that is, the surface of the AlGaN electron supply layer 3) using, for example, sputtering or vapor deposition.

Next, using, for example, a photolithography technique, resist openings are formed in regions other than the source electrode formation-scheduled region, the drain electrode formation-scheduled region, and the gate electrode formation-scheduled region.

Then, using the resists with the openings, the Ta films formed in the regions other than the source electrode formation-scheduled region, the drain electrode formation-scheduled region, and the gate electrode formation-scheduled region are removed by dry etching using, for example, a fluorine-based gas.

Figure 2B:
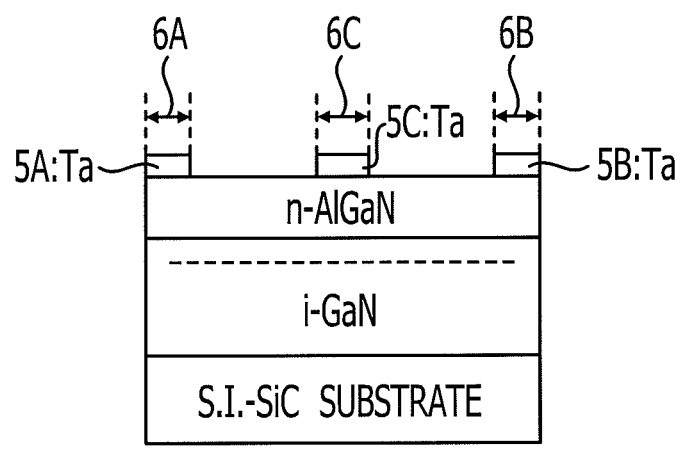

Thus, the Ta films (metal films) 5A to 5C are simultaneously formed over the surface of the GaN-based semiconductor lamination structure 4, as illustrated in FIG. 2B. That is, the Ta films 5A to 5C are simultaneously formed in the source electrode formation-scheduled region 6A, the drain electrode formation-scheduled region 6B, and the gate electrode formation-scheduled region 6C over the surface of the GaN-based semiconductor lamination structure 4, respectively.

Figure 2C:
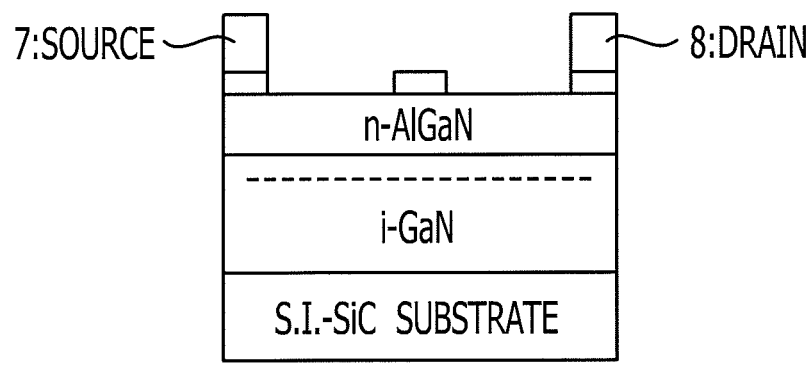

As illustrated in FIG. 2C, the source electrode 7 and the drain electrode 8 formed by an Al layer with a thickness of, for example, about 200 nm are respectively formed over the Ta films 5A and 5B in the source electrode formation-scheduled region 6A and the drain electrode formation-scheduled region 6B by, for example, a photolithography technique and a deposition/lift-off technique, as in the above-described first embodiment.

Figure 2D:
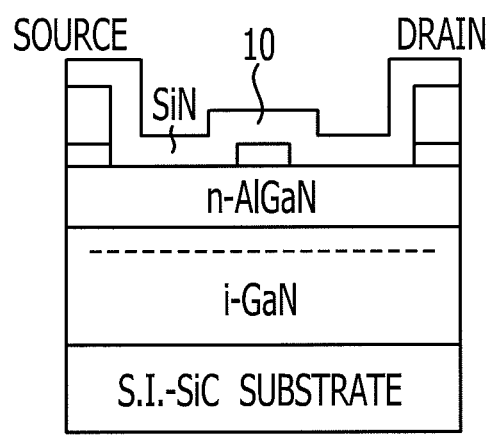

The passivation film (insulating film) 10 formed of, for example, SiN is formed over the entire surface, as illustrated in FIG. 2D. Before a TaO film forming process described below, the passivation film 10 may be formed to cover at least the surface of the GaN-based semiconductor lamination structure 4 (that is, the surface of the AlGaN electron supply layer 3).

Next, using, for example, a photolithography technique, the resist opening is formed in the gate electrode formation-scheduled region 6C.

Figure 2E:
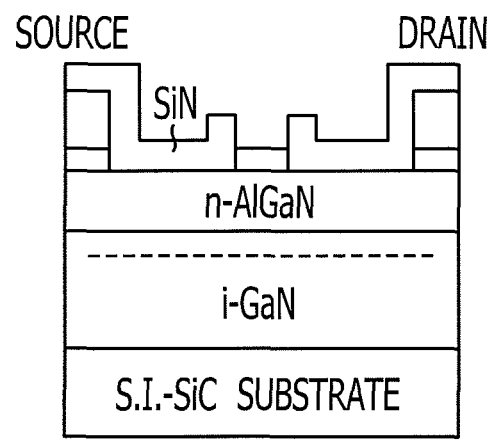

Then, using the resist with the opening, the SiN passivation film 10 formed in the gate electrode formation-scheduled region 6C is removed by dry etching using, for example, a fluorine-based gas, as illustrated in FIG. 2E.

Figure 2F:
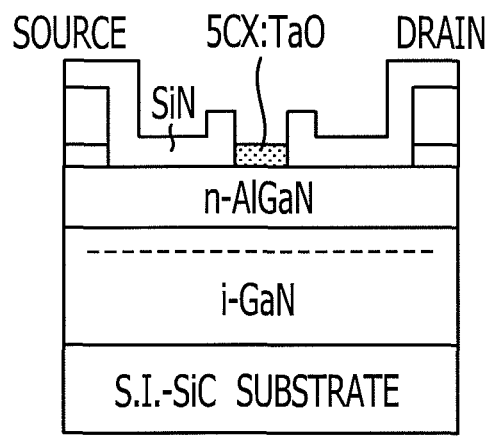

Thereafter, as illustrated in FIG. 2F, by performing heat treatment in an oxygen-containing atmosphere, the entire Ta film 5C of the gate electrode formation-scheduled region 6C is oxidized to form the TaO film 5CX, as in the above-described first embodiment. Here, the TaO film 5CX is an insulating metal oxide film and serves as a gate insulating film.

By this heat treatment, the ohmic characteristics of the source electrode 7 and the drain electrode 8 respectively formed in the Ta films 5A and 5B are also ensured. In this embodiment, however, it is difficult to oxidize the upper surfaces and the side surfaces of the source electrode 7 and the drain electrode 8 and the side surfaces of the Ta films 5A and 5B in the lower portions of the source electrode 7 and the drain electrode 8, since these surfaces are covered with the SiN passivation film 10.

Thus, a part (here, the Ta film 5C of the gate electrode formation-scheduled region 6C) of the plurality of Ta films 5A to 5C formed over the surface of the GaN-based semiconductor lamination structure 4 is oxidized to form the TaO film 5CX serving as a gate insulating film.

Figure 2G:
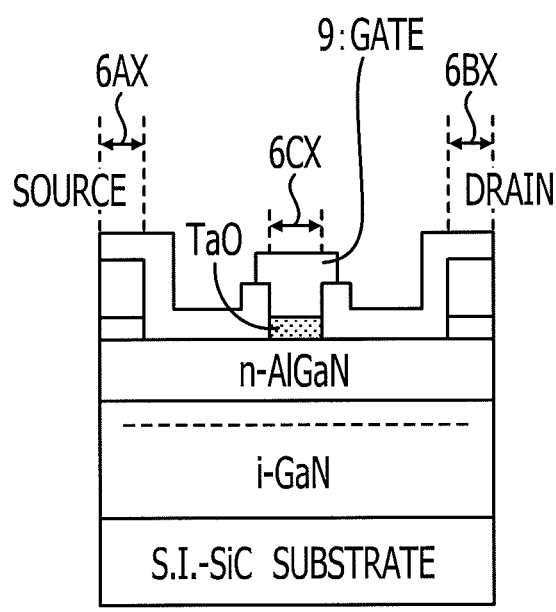

Next, as illustrated in FIG. 2G, the gate electrode 9 formed by an Au layer with a thickness of, for example, about 500 nm is formed over the TaO film 5CX formed in the gate electrode formation-scheduled region 6C by, for example, a photolithography technique and a deposition/lift-off technique.

Thus, the MIS type GaN-HEMT can be manufactured.

Since the other details of the manufacturing method are the same as those the above-described first embodiment, the detailed description will be omitted in this embodiment.

The MIS type GaN-HEMT manufactured in the above-described method according to this embodiment has the following configuration.

In the MIS type GaN-HEMT, as illustrated in FIG. 2G, the upper surfaces and the side surfaces of the source electrode 7 and the drain electrode 8 and the side surfaces of the Ta films 5A and 5B in the lower portions of the source electrode 7 and the drain electrode 8 are not covered with an oxide film but covered with the SiN passivation film 10.

In the MIS type GaN-HEMT, the upper portion of the gate electrode 9 is not covered with the SiN passivation film 10. The surface of the GaN-based semiconductor lamination structure 4, the side surface of the TaO film 5CX serving as an insulating film, and the side surface of the lower portion of the gate electrode 9 are covered with the SiN passivation film 10.

Since the other configuration is the same as that of the above-described first embodiment, the detailed description will be omitted in this embodiment.

In the compound semiconductor device and the method of manufacturing the same according to this embodiment, it is possible to implement the advantage of obtaining the good semiconductor/metal interface with the absence of residue in any of the regions where the source electrode 7, the drain electrode 8, and the gate electrode 9 are formed.

A compound semiconductor device and a method of manufacturing the compound semiconductor device according to a third embodiment will be described in reference to FIGS. 3A to 3E.

The compound semiconductor device and the method of manufacturing the same according to this embodiment is different from those according to the first embodiment in a passivation film 11X, as illustrated in FIGS. 3A to 3E. In FIGS. 3A to 3E, the same reference numerals are given to the same constituents as those of the above-described first embodiment.

Figure 3A:
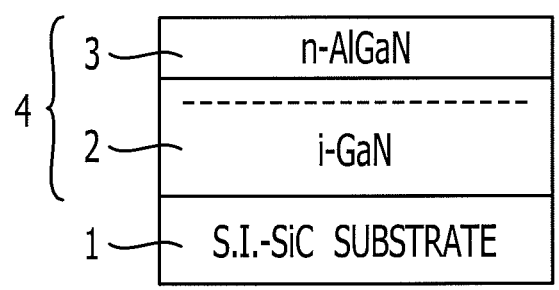
FIGS. 3A to 3E are schematic sectional views illustrating a compound semiconductor device and a method of manufacturing the same according to a third embodiment.

As illustrated in FIG. 3A, the i-GaN electron transit layer 2 and the n-AlGaN electron supply layer 3 are stacked over the semi-insulating SiC substrate 1 using, for example, the MOCVD method to form the GaN-based semiconductor lamination structure 4, as in the above-described first embodiment.

The surface of the GaN-based semiconductor lamination structure 4 (that is, the surface of the AlGaN electron supply layer 3) is cleaned using, for example, an organic solvent or acid, as in the above-described first embodiment.

Figure 3B:
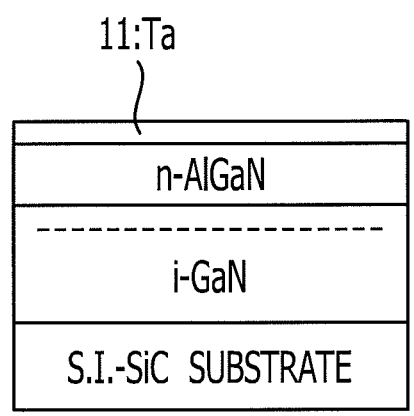

As illustrated in FIG. 3B, a Ta film 11 with a thickness of, for example, about 20 nm is formed over the surface of the GaN-based semiconductor lamination structure 4 (that is, the entire surface of the AlGaN electron supply layer 3) using, for example, sputtering or vapor deposition.

Figure 3C:
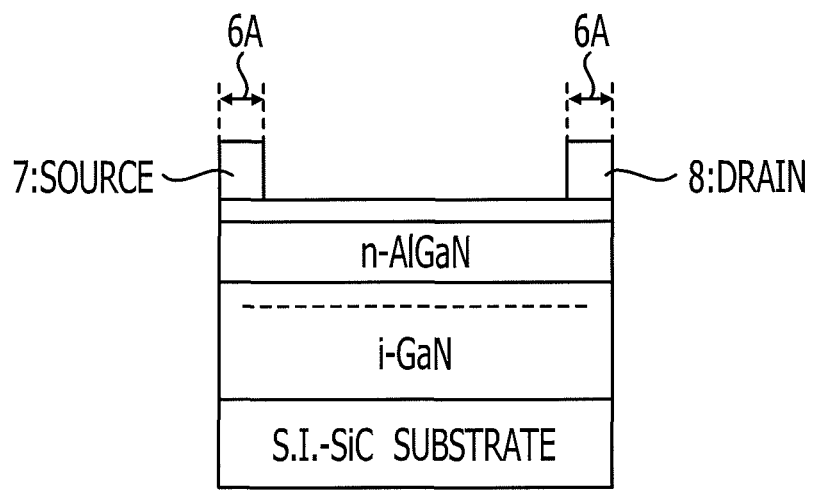

As illustrated in FIG. 3C, the source electrode 7 and the drain electrode 8 formed by an Al layer with a thickness of, for example, about 200 nm are formed over the Ta film 11 formed in the source electrode formation-scheduled region 6A and the drain electrode formation-scheduled region 6B by, for example, a photolithography technique and a deposition/lift-off technique, respectively, as in the above-described first embodiment.

Figure 3D:
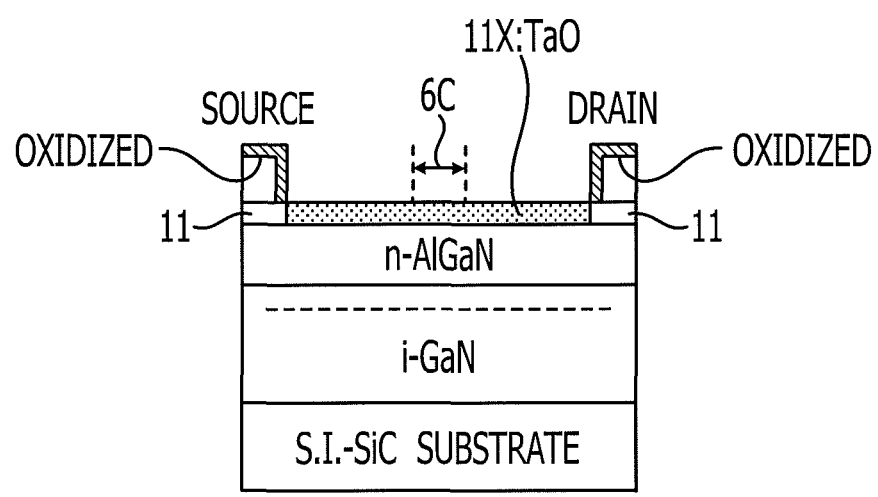

As illustrated in FIG. 3D, a TaO film 11X is formed by oxidizing the entire Ta film 11 formed in the region between the source electrode formation-scheduled region 6A and the drain electrode formation-scheduled region 6B (including the gate electrode formation-scheduled region 6C), as in the above-described first embodiment. Here, the TaO film 11X is an insulating metal oxide film. In this embodiment, the TaO film 11X formed in the gate electrode formation-scheduled region 6C serves as a gate insulating film. The TaO film 11X formed in the region other than the gate electrode formation-scheduled region 6C between the source electrode formation-scheduled region 6A and the drain electrode formation-scheduled region 6B serves as a passivation film (insulating film) covering the surface of the GaN-based semiconductor lamination structure 4 (that is, the surface of the AlGaN electron supply layer 3).

By this heat treatment, the upper surfaces and the side surfaces of the source electrode 7 and the drain electrode 8 are also simultaneously oxidized. By this heat treatment, the ohmic characteristics of the source electrode 7 and the drain electrode 8 respectively formed over the Ta film 11 formed in the source electrode formation-scheduled region 6A and the drain electrode formation-scheduled region 6B are also ensured.

Thus, the TaO film 11X serving as a gate insulating film is formed by oxidizing a part (here, the Ta film 11 formed in the region other than the source electrode formation-scheduled region 6A and the drain electrode formation-scheduled region 6B) of the Ta film 11 formed over the surface of the GaN-based semiconductor lamination structure 4.

Figure 3E:
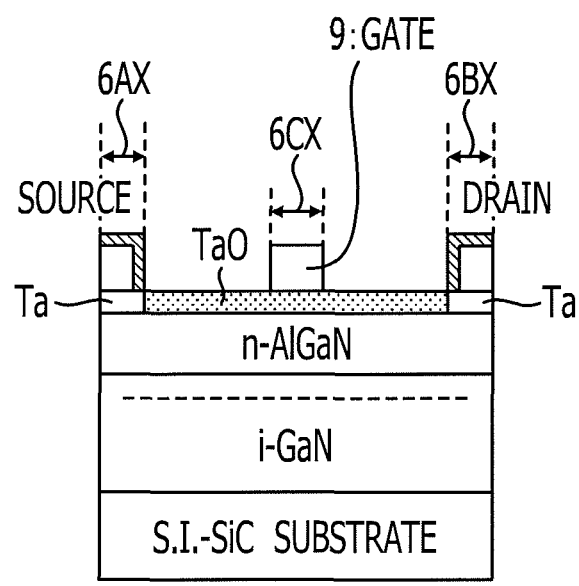

Next, as illustrated in FIG. 3E, the gate electrode 9 formed by an Au layer with a thickness of, for example, about 500 nm is formed over the TaO film 11X formed in the gate electrode formation-scheduled region 6C by, for example, a photolithography technique and a deposition/lift-off technique.

Thus, the MIS type GaN-HEMT can be manufactured.

Since the other details of the manufacturing method are the same as those in the above-described first embodiment, the detailed description will be omitted in this embodiment.

In this embodiment, as described above, the Ta film 11 is simultaneously formed in the entire surface of the GaN-based semiconductor lamination structure 4 (see FIG. 3B).

The source electrode 7 and the drain electrode 8 are formed over the Ta film 11 formed in the source electrode formation-scheduled region 6A and the drain electrode formation-scheduled region 6B, respectively (see FIG. 3C). The gate electrode 9 is formed over the TaO film 11X formed by oxidizing the Ta film 11 formed in the gate electrode formation-scheduled region 6C (see FIG. 3E). The TaO film 11X oxidizing the Ta film 11 formed in the region other than the gate electrode formation-scheduled region 6C between the source electrode formation-scheduled region 6A and the drain electrode formation-scheduled region 6B serves as the passivation film covering the surface of the GaN-based semiconductor lamination structure 4 (see FIG. 3E).

In this case, the Ta film 11 between the GaN-based semiconductor lamination structure 4 and the source and drain electrodes 7 and 8, the Ta film 11 forming the TaO film 11X between the GaN-based semiconductor lamination structure 4 and the gate electrode 9, and the Ta film 11 forming the TaO film 11X covering the surface of the GaN-based semiconductor lamination structure 4 are simultaneously formed (see FIG. 3B). That is, the Ta film 11 contacting the lower portions of the source electrode 7 and the drain electrode 8 and contacting the surface of the GaN-based semiconductor lamination structure 4, the Ta film 11 forming the TaO film 11X contacting the lower portion of the gate electrode 9 and contacting the surface of the GaN-based semiconductor lamination structure 4, and the Ta film 11 forming the TaO film 11X covering the surface of the GaN-based semiconductor lamination structure 4 are simultaneously formed.

Thus, the lowermost layers (first layers) of the lamination structures in the source electrode formation region 6AX, the drain electrode formation region 6BX, and the gate electrode formation region 6CX and the layer serving as the passivation film covering the surface of the GaN-based semiconductor lamination structure 4 (that is, the layer (Ta film 11) contacting the surface of the GaN-based semiconductor lamination structure 4) are simultaneously formed (See FIGS. 3B and 3E).

In this case, the surface of the GaN-based semiconductor lamination structure 4 can be cleaned before the layers contacting the surface of the GaN-based semiconductor lamination structure 4 are formed.

Therefore, the good semiconductor/metal interface with no residue can be obtained in any of the regions where the source electrode 7, the drain electrode 8, and the gate electrode 9 are formed.

Since the good semiconductor/metal interfaces can be obtained as the semiconductor/metal interfaces of the source electrode formation region 6AX and the drain electrode formation region 6BX, contact resistance can be reduced. Since the good semiconductor/metal interface can be obtained as the semiconductor/metal interface of the gate electrode formation region 6CX, the interface level becomes small; and thus, a phenomenon caused by a trap of current collapse, a variation in a threshold value or the like is suppressed.

The good semiconductor/insulating film interface absent any residue can be obtained even in the region where the passivation film (TaO film 11X) is formed.

That is, in general, the passivation film covering the surface of the GaN-based semiconductor lamination structure is formed over the source electrode, the drain electrode, and the gate electrode in different processes. Therefore, it is difficult to form the interface between the GaN-based semiconductor lamination structure and the passivation film (that is, the semiconductor/insulating film interface) as the good semiconductor/insulating film interface with no residue. However, as described above, the lowermost layers (first layers) of the lamination structures formed in the source electrode formation region 6AX, the drain electrode formation region 6BX, and the gate electrode formation region 6CX and the layer (the Ta film 11) serving as the passivation film covering the surface of the GaN-based semiconductor lamination structure 4 are simultaneously formed. Thus, since it is possible to prevent the residue from intruding into the lower portion of the passivation film (that is, the semiconductor/insulating film interface), the good semiconductor/insulating film interface with no residue can be obtained.

As described above, by covering the surface of the GaN-based semiconductor lamination structure 4 with the Ta film 11 and then oxidizing the Ta film 11 to forms TaO film 11X as the passivation film, it is possible to prevent the surface of the GaN-based semiconductor lamination structure 4 from being oxidized.

Since the other details are the same as those of the above-described first embodiment, the description will be omitted in this embodiment.

The MIS type GaN-HEMT manufactured in the above-described method according to this embodiment has the following structure.

In the MIS type GaN-HEMT, the Ta film 11 and the TaO film 11X are formed over the GaN-based semiconductor lamination structure 4, as illustrated in FIG. 3E.

In the MIS type GaN-HEMT, the source electrode 7 and the drain electrode 8 are formed over the Ta film 11.

In the MIS type GaN-HEMT, the TaO film 11X is formed over the entire surface of the GaN-based semiconductor lamination structure 4 in the region between the source electrode formation region 6AX and the drain electrode formation region 6BX.

In the MIS type GaN-HEMT, the gate electrode 9 is formed over the TaO film 11X.

The TaO film 11X immediately below the gate electrode 9 is the gate insulating film. The TaO film 11X formed in the region other than the gate electrode formation-scheduled region 6C between the source electrode formation region 6AX and the drain electrode formation region 6BX is the passivation film. That is, the MIS type GaN-HEMT has no SiN passivation film.

In the MIS type GaN-HEMT, the Ta film 11 formed below the source electrode 7 and the drain electrode 8, the TaO film 11X below the gate electrode 9, and the Tao film 11X covering the surface of the GaN-based semiconductor lamination structure 4 in the region between the source electrode 7 and the drain electrode 8 all contain Ta. That is, the metal film 11 between the source and drain electrodes 7 and 8 and the GaN-based semiconductor lamination structure 4, the insulating metal oxide film 11X between the gate electrode 9 and the GaN-based semiconductor lamination structure 4, and the insulating metal oxide film 11X covering the surface of the GaN-based semiconductor lamination structure 4 contain the same metal element (here, Ta).

The first layers of the lamination structures contacting the surface of the GaN-based semiconductor lamination structure 4 in the source electrode formation region 6AX and the drain electrode formation region 6BX are the Ta film (metal film) 11. The first layer of the lamination structure contacting the surface of the GaN-based semiconductor lamination structure 4 in the gate electrode formation region 6CX is the TaO film (an insulating metal oxide film: an insulating film) 11X. The passivation film contacting the surface of the GaN-based semiconductor lamination structure 4 in the region other than the gate electrode formation region 6CX between the source electrode formation region 6AX and the drain electrode formation region 6BX is the TaO film (an insulating metal oxide film: an insulating film) 11X. That is, the first layers of the lamination structures contacting the surface of the GaN-based semiconductor lamination structure 4 in the source electrode formation region 6AX and the drain electrode formation region 6BX, respectively, the first layer of the lamination structure contacting the surface of the GaN-based semiconductor lamination structure 4 in the gate electrode formation region 6CX, and the passivation film contacting the surface of the GaN-based semiconductor lamination structure 4 in the region other than the source electrode formation region 6AX, the drain electrode formation region 6BX, and the gate electrode formation region 6CX contain the same metal element (here, Ta).

In the MIS type GaN-HEMT, the upper surfaces and the side surfaces of the source electrode 7 and the drain electrode 8 are covered with the oxide film. In the MIS type GaN-HEMT, the upper surface and the side surface of the gate electrode 9 is not covered with the passivation film.

Since the other details are the same as those of the above-described first embodiment, the description will be omitted in this embodiment.

In the compound semiconductor device and the method of manufacturing the same according to this embodiment, it is possible to implement the advantage that the good semiconductor/metal interface with no residue can be obtained in any of the regions where the source electrode 7, the drain electrode 8, and the gate electrode 9 are formed.

This embodiment has hitherto been described as a modified example of the above-described first embodiment, but the invention is not limited thereto. For example, the embodiment may be implemented as a modified example of the above-described second embodiment.

A compound semiconductor device and a method of manufacturing the same according to a fourth embodiment will be described in reference to FIGS. 4A to 4H.

The compound semiconductor device and the method of manufacturing the same according to this embodiment are different from those according to the above-described first embodiment in the recess structures 13A and 13B in which the source electrode 7 and the drain electrode 8 are formed, respectively. In FIGS. 4A to 4H, the same reference numerals are given to the same constituents as those of the above-described first embodiment.

Figure 4A:
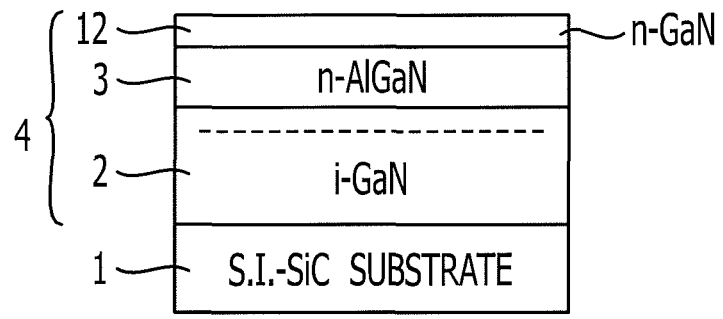
FIGS. 4A to 4H are schematic sectional views illustrating a compound semiconductor device and a method of manufacturing the same according to a fourth embodiment.

As illustrated in FIG. 4A, the i-GaN electron transit layer 2, the n-AlGaN electron supply layer 3, and an n-GaN cap layer 12 are stacked over the semi-insulating SiC substrate 1 using, for example, the MOCVD method to form the GaN-based semiconductor lamination structure 4.

The i-GaN electron transit layer 2 has a thickness of, for example, about 3 µm. The n-AlGaN electron supply layer 3 has a thickness of, for example, about 30 nm and the Si doping density of the n-AlGaN electron supply layer 3 is, for example, about $5\times10^{18}$ cm$^{-3}$. The n-GaN cap layer 12 has a thickness of, for example, about 10 nm and the Si doping density of the n-GaN cap layer 12 is, for example, about $5\times10^{18}$ cm$^{-3}$. When an i-AlGaN spacer layer is provided, the thickness of the i-AlGaN spacer layer is, for example, about 5 nm.

Figure 4B:
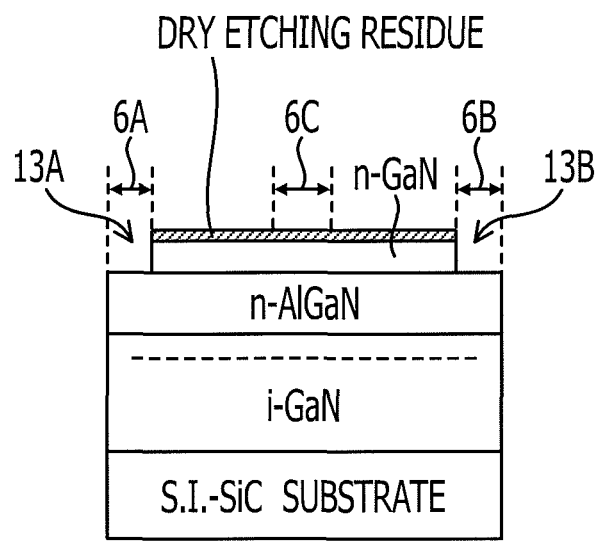

As illustrated in FIG. 4B, recesses 13A and 13B are formed in the source electrode formation-scheduled region 6A and the drain electrode formation-scheduled region 6B, respectively.

Resist openings are respectively formed in the source electrode formation-scheduled region 6A and the drain electrode formation-scheduled region 6B using, for example, a photolithography technique.

Then, using the resists with the openings, the GaN cap layer 12 in the source electrode formation-scheduled region 6A and the drain electrode formation-scheduled region 6B are removed by dry etching using, for example, a chlorine-based gas to form the recesses 13A and 13B, respectively. The recess 13A is also referred to as a source recess and the recess 13B is also referred to as a drain recess. The recesses 13A and 13B are collectively referred to as ohmic recesses.

The recesses 13A and 13B are formed by removing the entire GaN cap layer 12, which is the uppermost layer of the GaN-based semiconductor lamination structure 4, so as to expose the surface of the AlGaN electron supply layer 3, which is the second layer from the surface of the GaN-based semiconductor lamination structure 4, but the invention is not limited thereto. For example, the recesses 13A and 13B may be formed by removing a part of the GaN cap layer 12 so that a part of the GaN cap layer 12 which is the uppermost layer of the GaN-based semiconductor lamination structure 4 remains. For example, the recesses 13A and 13B may be formed by removing the entire GaN cap layer 12, which is the uppermost layer of the GaN-based semiconductor lamination structure 4, and removing a part of the AlGaN electron supply layer 3, which is the second layer from the surface of the GaN-based semiconductor lamination structure 4.

Figure 4C:
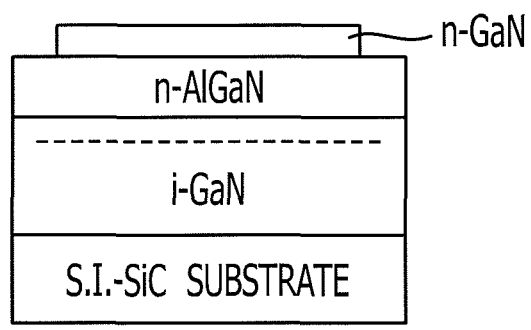

As illustrated in FIG. 4C, the surface of the GaN-based semiconductor lamination structure 4 including the recesses 13A and 13B (that is, the surfaces of the GaN cap layer 12 and the AlGaN electron supply layer 3) are sufficiently cleaned using, for example, an organic solvent or acid. In this embodiment, in order to remove the residue on the GaN cap layer 12 occurring in the dry etching, the surfaces of the GaN cap layer 12 and the AlGaN electron supply layer 3 are cleaned using, for example, a sulfuric acid hydrogen peroxide mixture (SPM).

Next, using, for example, a photolithography technique, resist openings are respectively formed in the source electrode formation-scheduled region 6A, the drain electrode formation-scheduled region 6B, and the gate electrode formation-scheduled region 6C over the surface of the GaN-based semiconductor lamination structure 4 (that is, the surfaces of the GaN cap layer 12 and the AlGaN electron supply layer 3).

Figure 4D:
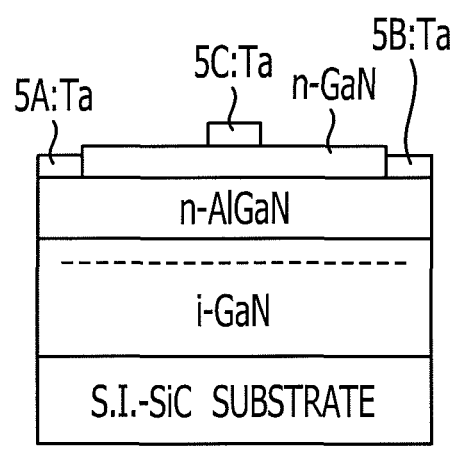

Then, using the resists with the opening, as illustrated in FIG. 4D, Ta films (metal films) 5A to 5C with a thickness of, for example, about 20 nm are simultaneously formed over the surface of the GaN-based semiconductor lamination structure 4 by, for example, a deposition/lift-off technique. That is, Ta film 5C is formed in the gate electrode formation-scheduled region 6C over the surface of the GaN cap layer 12, which is the uppermost layer of the GaN-based semiconductor lamination structure 4; and simultaneously, the Ta films 5A and 5B are respectively formed in the recesses 13A and 13B formed in the source electrode formation-scheduled region 6A and the drain electrode formation-scheduled region 6B. Here, since the bottom surfaces of the recesses 13A and 13B formed in the source electrode formation-scheduled region 6A and the drain electrode formation-scheduled region 6B are the surface of the AlGaN electron supply layer 3, which is the second layer from the surface of the GaN-based semiconductor lamination structure 4, the Ta films 5A and 5B are formed over the surface of the AlGaN electron supply layer 3.

Figure 4E:
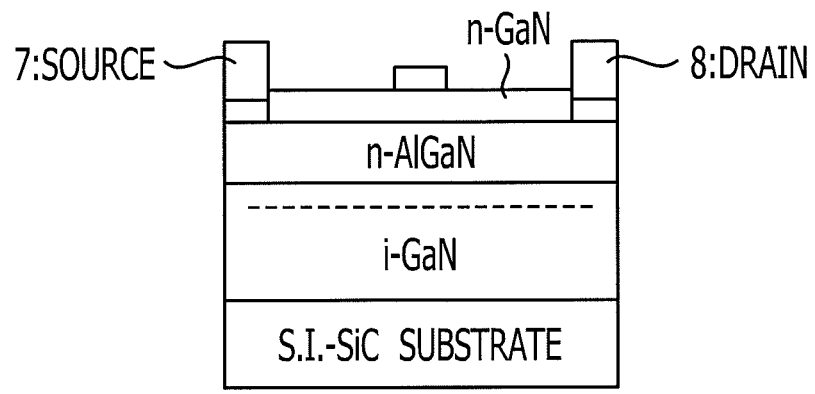

As illustrated in FIG. 4E, the source electrode 7 and the drain electrode 8 formed by an Al layer with a thickness of, for example, about 200 nm, are respectively formed over the Ta films 5A and 5B formed in the source electrode formation-scheduled region 6A and the drain electrode formation-scheduled region 6B by, for example, a photolithography technique and a deposition/lift-off technique, as in the above-described first embodiment.

Figure 4F:
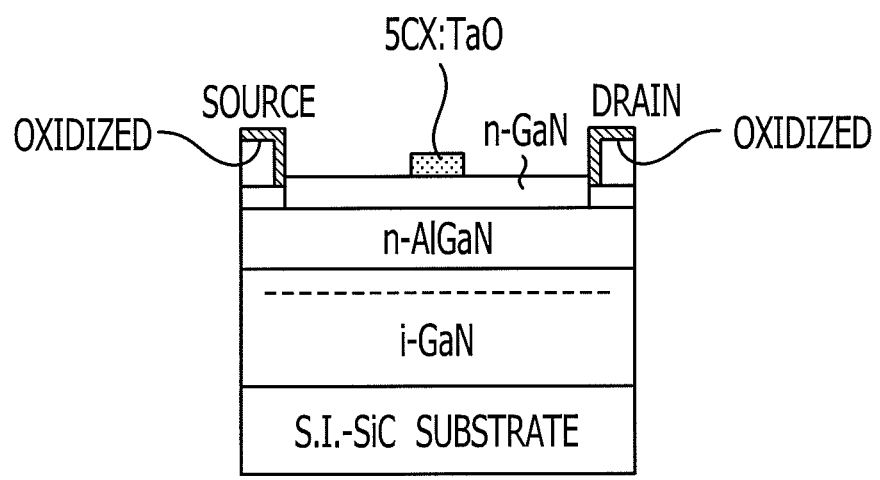

As illustrated in FIG. 4F, by performing heat treatment in an oxygen-containing atmosphere, the entire Ta film 5C of the gate electrode formation-scheduled region 6C is oxidized to form the TaO film 5CX, as in the above-described first embodiment. The TaO film 5CX is an insulating metal oxide film and serves as a gate insulating film.

Thus, a part (here, the Ta film 5C of the gate electrode formation-scheduled region 6C) of the plurality of Ta films 5A to 5C formed over the surface of the GaN-based semiconductor lamination structure 4 is oxidized to form the TaO film 5CX serving as a gate insulating film.

Figure 4G:
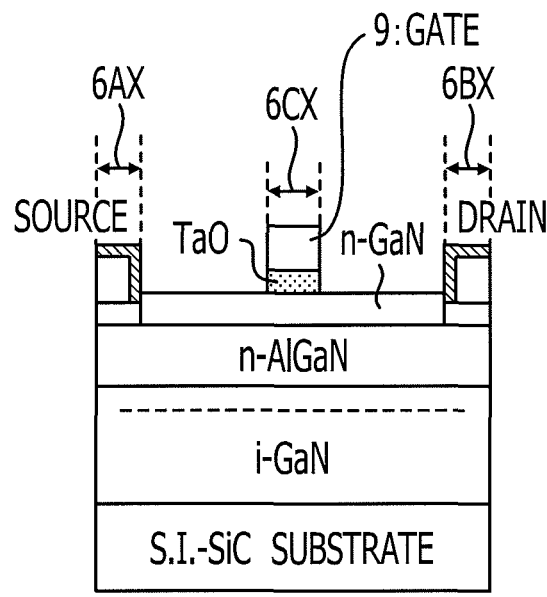

As illustrated in FIG. 4G, the gate electrode 9 formed by an Au layer with a thickness of, for example, about 500 nm is formed over the TaO film 5CX formed in the gate electrode formation-scheduled region 6C by, for example, a photolithography technique and a deposition/lift-off technique, as in the above-described first embodiment.

Figure 4H:
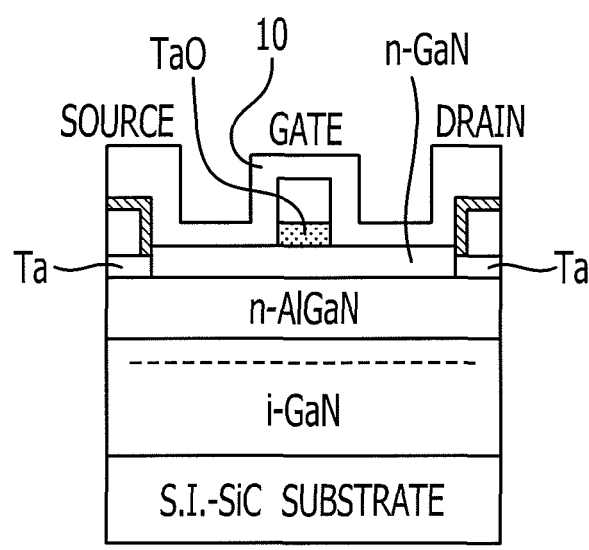

Finally, as illustrated in FIG. 4H, the passivation film (insulating film) 10 formed of, for example, SiN is formed over the entire surface, as in the above-described first embodiment.

Thus, the MIS type GaN-HEMT can be manufactured.

Since the other details of the manufacturing method are the same as those the above-described first embodiment, the detailed description thereof will be omitted in this embodiment.

The MIS type GaN-HEMT manufactured in the above-described method according to this embodiment has the following configuration.

As illustrated in FIG. 4H, the MIS type GaN-HEMT includes the GaN-based semiconductor lamination structure 4 including the i-GaN electron transit layer 2, the n-AlGaN electron supply layer 3, and the n-GaN cap layer 12 over the semi-insulating SIC substrate 1. That is, the MIS type GaN-HEMT includes the GaN-based semiconductor lamination structure 4 including the n-GaN cap layer 12 in the uppermost layer and the AlGaN electron supply layer 3 in the second layer from the surface of the GaN-based semiconductor lamination structure 4.

In the MIS type GaN-HEMT, the GaN cap layer 12 of the source electrode formation region 6AX and the drain electrode formation region 6BX is removed to form the recesses 13A and 13B, respectively.

In the MIS type GaN-HEMT, the TaO film 5CX serving as the gate insulating film is formed in the gate electrode formation region 6CX over the surface of the GaN cap layer 12 which is the uppermost layer of the GaN-based semiconductor lamination structure 4; and the Ta films 5A and 5B are respectively formed in the recesses 13A and 13B formed in the source electrode formation region 6AX and the drain electrode formation region 6BX, that is, over the surface of the AlGaN electron supply layer 3 which is the second layer from the surface of the GaN-based semiconductor lamination structure 4.

The first layers of the lamination structures contacting the surface of the GaN-based semiconductor lamination structure 4 in the source electrode formation region 6AX and the drain electrode formation region 6BX are the Ta films (metal films) 5A and 5B. The first layer of the lamination structure contacting the surface of the GaN-based semiconductor lamination structure 4 in the gate electrode formation region 6CX is the TaO (an insulating metal oxide film: an insulating film) 5CX. That is, the first layers of the lamination structures respectively contacting the surface of the GaN-based semiconductor lamination structure 4 in the source electrode formation region 6AX and the drain electrode formation region 6BX and the first layer of the lamination structure contacting the surface of the GaN-based semiconductor lamination structure 4 in the gate electrode formation region 6CX contain the same metal element (here, Ta).

In the MIS type GaN-HEMT, the upper surfaces and the side surfaces of the source electrode 7 and the drain electrode 8 are covered with the oxide film.

Since the other details of the manufacturing method are the same as those the above-described first embodiment, the detailed description will be omitted in this embodiment.

Accordingly, in the compound semiconductor device and the method of manufacturing the same according to this embodiment, it is possible to implement the advantage of obtaining the good semiconductor/metal interface in the absence of residue in any of the regions where of the source electrode 7, the drain electrode 8, and the gate electrode 9 are formed.

This embodiment has hitherto been described as a modified example of the above-described first embodiment, but the invention is not limited thereto. For example, this embodiment may be implemented as modified examples of the above-described second and third embodiments.

A compound semiconductor device and a method of manufacturing the same according to a fifth embodiment will be described in reference to FIGS. 5A to 5G.

The compound semiconductor device and the method of manufacturing the same according to this embodiment are different from those of the above-described third embodiment in a recess structure 13C in which the gate electrode 9 is formed. In FIGS. 5A to 5G, the same reference numerals are given to the same constituents as those of the above-described third embodiment.

Figure 5A:
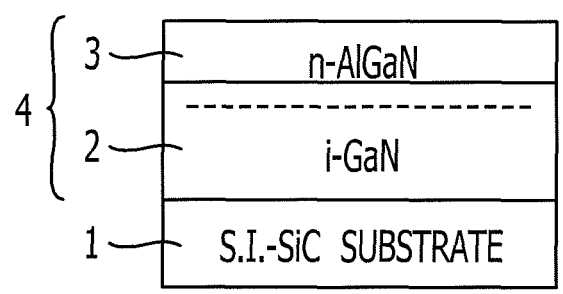
FIGS. 5A to 5G are schematic sectional views illustrating a compound semiconductor device and a method of manufacturing the same according to a fifth embodiment.

As illustrated in FIG. 5A, the i-GaN electron transit layer 2 and the n-AlGaN electron supply layer 3 are stacked over the semi-insulating SiC substrate 1 using, for example, the MOCVD method to form the GaN-based semiconductor lamination structure 4, as in the above-described third embodiment.

Figure 5B:
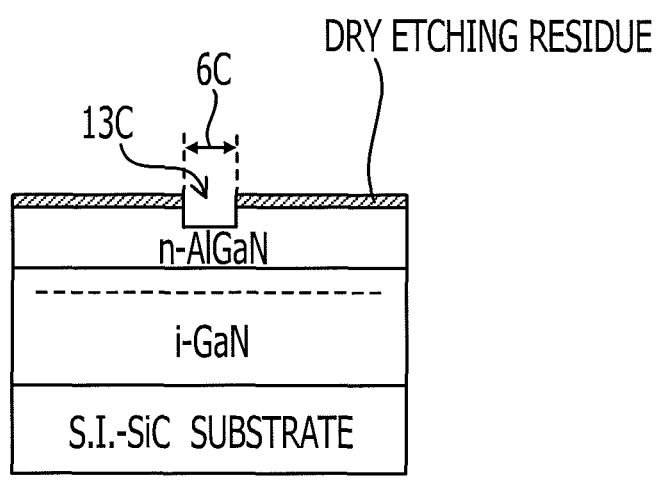

As illustrated in FIG. 5B, the recess 13C is formed in the gate electrode formation-scheduled region 6C.

Using, for example, a photolithography technique, a resist opening is formed in the gate electrode formation-scheduled region 6C.

Then, using the resist with the opening, the recess 13C is formed by removing a part of the AlGaN electron supply layer 3 in the gate electrode formation-scheduled region 6C by dry etching using, for example, a fluorine-based gas. The recess 13C is also referred to as a gate recess.

Figure 5C:
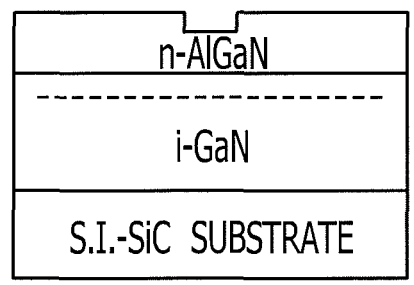

As illustrated in FIG. 5C, the surface of the GaN-based semiconductor lamination structure 4 including the recess 13C (that is, the surface of the AlGaN electron supply layer 3) are cleaned using, for example, an organic solvent or acid. In this embodiment, in order to remove the residue on the AlGaN electron supply layer 3 occurring in the dry etching, the AlGaN electron supply layer 3 is cleaned using, for example, a sulfuric acid hydrogen peroxide mixture (SPM).

Figure 5D:
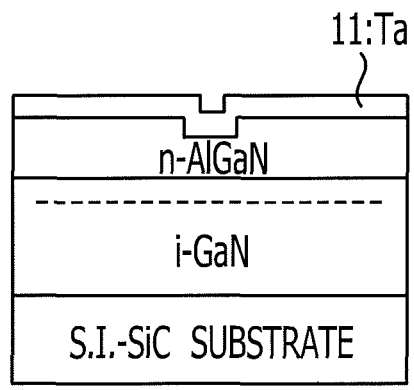

As illustrated in FIG. 5D, the Ta film 11 with a thickness, for example, about 20 nm is formed over the surface of the GaN-based semiconductor lamination structure 4 including the recess 13C (that is, the entire surface of the AlGaN electron supply layer 3) by, for example, sputtering or vapor deposition.

Figure 5E:
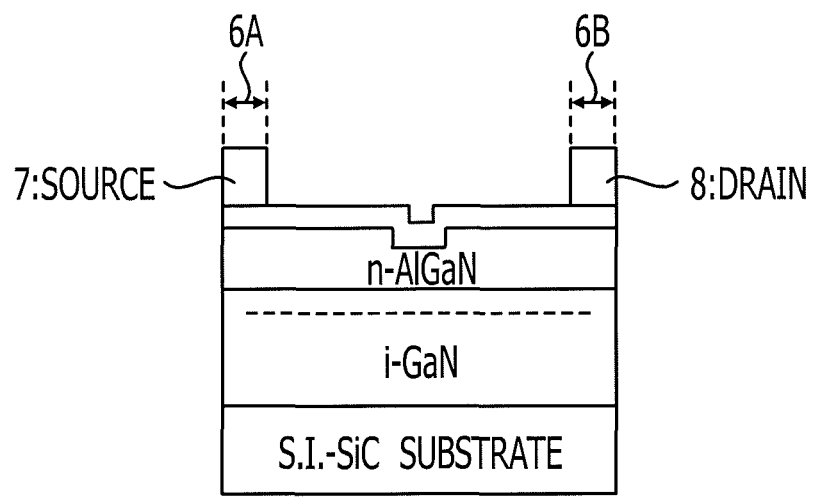

As illustrated in FIG. 5E, the source electrode 7 and the drain electrode 8 formed by an Al layer with a thickness of, for example, about 200 nm, are formed over the Ta film 11 in the source electrode formation-scheduled region 6A and the drain electrode formation-scheduled region 6B by, for example, a photolithography technique and a deposition/lift-off technique, respectively, as in the above-described third embodiment.

Figure 5F:
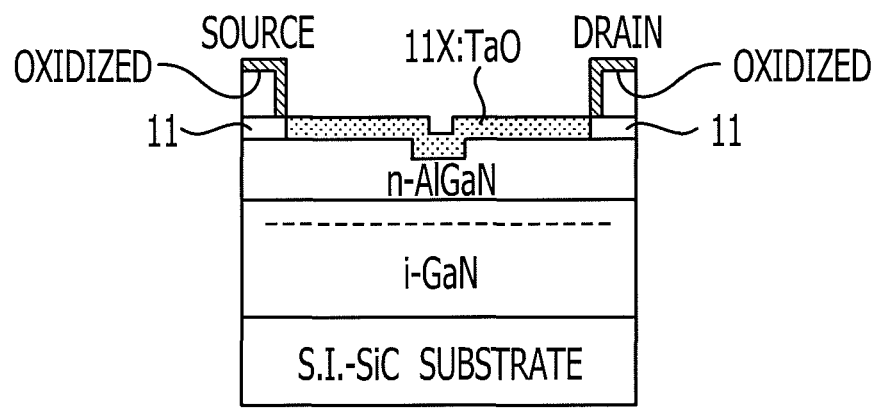

As illustrated in FIG. 5F, a TaO film 11X is formed by oxidizing the entire Ta film 11 formed in the region between the source electrode formation-scheduled region 6A and the drain electrode formation-scheduled region 6B (including the gate electrode formation-scheduled region 6C), as in the above-described third embodiment. In this embodiment, the TaO film 11X formed in the gate electrode formation-scheduled region 6C serves as a gate insulating film. The TaO film 11X formed in the region other than the gate electrode formation-scheduled region 6C between the source electrode formation-scheduled region 6A and the drain electrode formation-scheduled region 6B serves as a passivation film (insulating film) covering the surface of the GaN-based semiconductor lamination structure 4 (that is, the surface of the AlGaN electron supply layer 3).

Thus, the TaO film 11X serving as a gate insulating film is formed by oxidizing a part (here, the Ta film 11 formed in the region other than the source electrode formation-scheduled region 6A and the drain electrode formation-scheduled region 6B) of the Ta film 11 formed over the surface of the GaN-based semiconductor lamination structure 4.

Figure 5G:
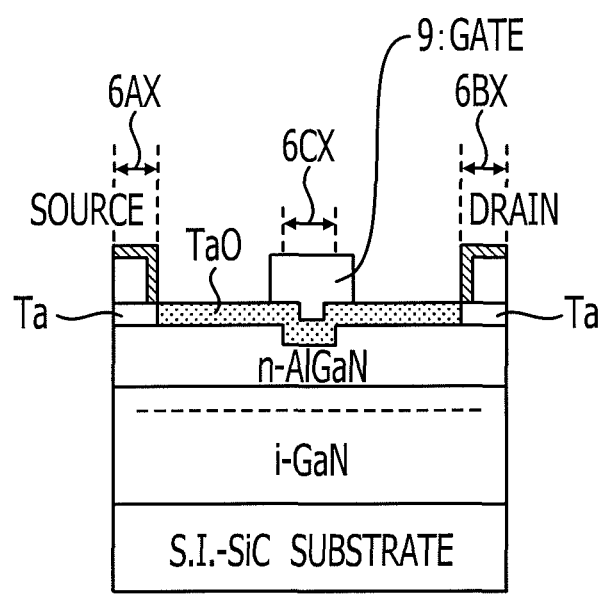

As illustrated in FIG. 5G, the gate electrode 9 formed by an Au layer with a thickness of, for example, about 500 nm is formed over the TaO film 11X formed in the gate electrode formation-scheduled region 6C by, for example, a photolithography technique and a deposition/lift-off technique, as in the above-described third embodiment.

Thus, the MIS type GaN-HEMT can be manufactured.

Since the other details of the manufacturing method are the same as those the above-described third embodiment, the detailed description will be omitted in this embodiment.

The MIS type GaN-HEMT manufactured in the above-described method according to this embodiment has the following structure.

In the MIS type GaN-HEMT, as illustrated in FIG. 5G, the recess 13C is formed by removing a part of the AlGaN electron supply layer 3 in the gate electrode formation region 6CX.

In the MIS type GaN-HEMT, the gate electrode 9 is formed over the TaO film 11X formed in the recess 13C.

Since the other details of the manufacturing method are the same as those the above-described third embodiment, the detailed description will be omitted in this embodiment.

Accordingly, in the compound semiconductor device and the method of manufacturing the same according to this embodiment, it is possible to implement the advantage of obtaining the good semiconductor/metal interface in the absence of residue in any of the regions where of the source electrode 7, the drain electrode 8, and the gate electrode 9 are formed.

This embodiment has hitherto been described as a modified example of the above-described third embodiment, but the invention is not limited thereto. For example, this embodiment may be implemented as modified examples of the above-described first and second embodiments.

A compound semiconductor device and a method of manufacturing the same according to a sixth embodiment will be described in reference to FIGS. 6A to 6F.

The compound semiconductor device and the method of manufacturing the same according to this embodiment are different from those of the above-described first embodiment in an electron supply layer 3A included in the GaN-based semiconductor lamination structure 4. In FIGS. 6A to 6F, the same reference numerals are given to the same constituents as those of the above-described first embodiment.

Figure 6A:
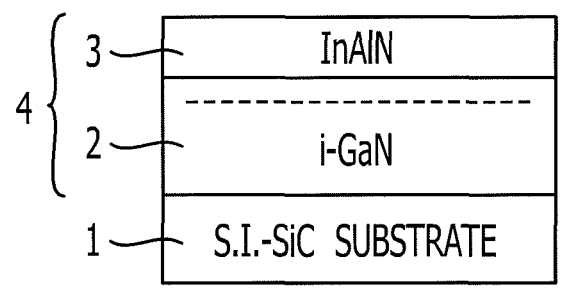
FIGS. 6A to 6F are schematic sectional views illustrating a compound semiconductor device and a method of manufacturing the same according to a sixth embodiment.

As illustrated in FIG. 6A, the i-GaN electron transit layer 2 and the InAlN electron supply layer 3A are stacked over the semi-insulating SIC substrate 1 using, for example, the MOCVD method to form the GaN-based semiconductor lamination structure 4, as in the above-described first embodiment.

The thickness of the i-GaN electron transit layer 2 is, for example, about 3 μm. The thickness of the InAlN electron supply layer 3A is, for example, about 30 nm.

The surface of the GaN-based semiconductor lamination structure 4 (that is, the surface of the InAlN electron supply layer 3A) is cleaned using, for example, an organic solvent or acid, as in the above-described first embodiment.

Figure 6B:
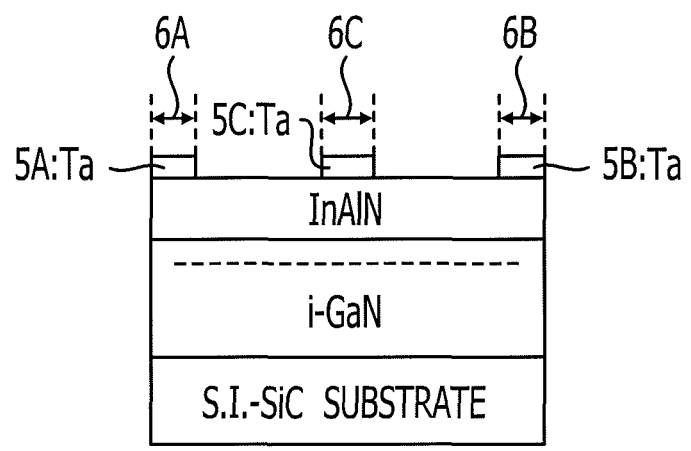

As illustrated in FIG. 6B, the Ta films (metal films) 5A to 5C with a thickness of, for example, about 20 nm are simultaneously formed in the source electrode formation-scheduled region 6A, the drain electrode formation-scheduled region 6B, and the gate electrode formation-scheduled region 6C over the GaN-based semiconductor lamination structure 4 by, for example, a photolithography technique and a deposition/lift-off technique, as in the above-described first embodiment.

Figure 6C:
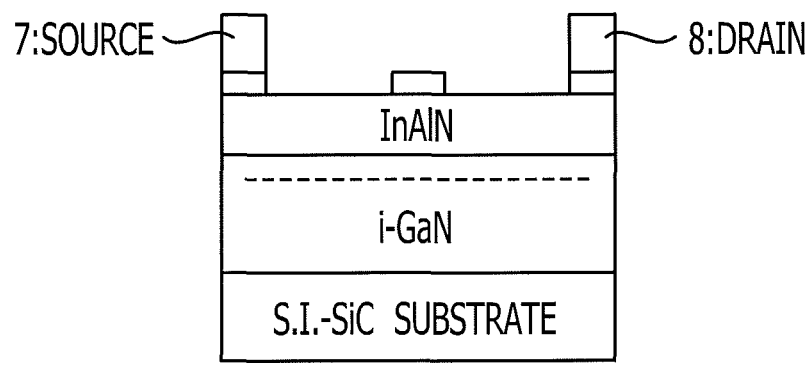

As illustrated in FIG. 6C, the source electrode 7 and the drain electrode 8 formed by an Al layer with a thickness of, for example, about 200 nm, are respectively formed in the source electrode formation-scheduled region 6A and the drain electrode formation-scheduled region 6B over the Ta films 5A and 5B formed by, for example, a photolithography technique and a deposition/lift-off technique, as in the above-described first embodiment.

Figure 6D:
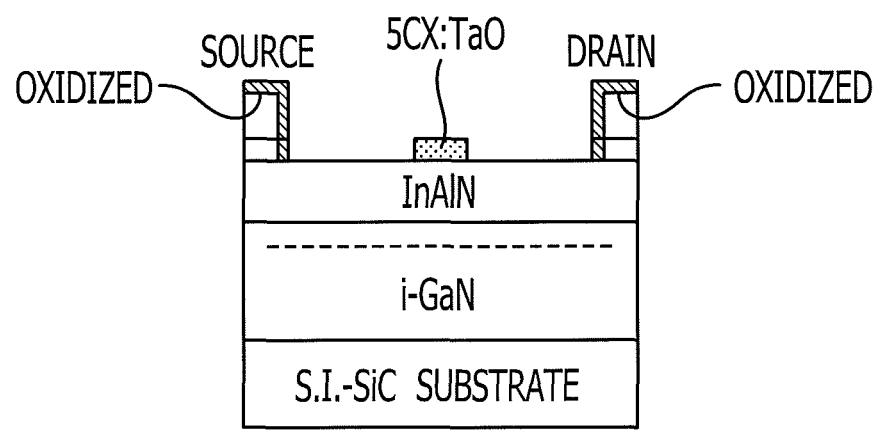

As illustrated in FIG. 6D, by performing heat treatment in an oxygen-containing atmosphere, the entire Ta film 5C of the gate electrode formation-scheduled region 6C is oxidized to form the TaO film 5CX, as in the above-described first embodiment. Here, the TaO film 5CX is an insulating metal oxide film and serves as a gate insulating film.

Figure 6E:
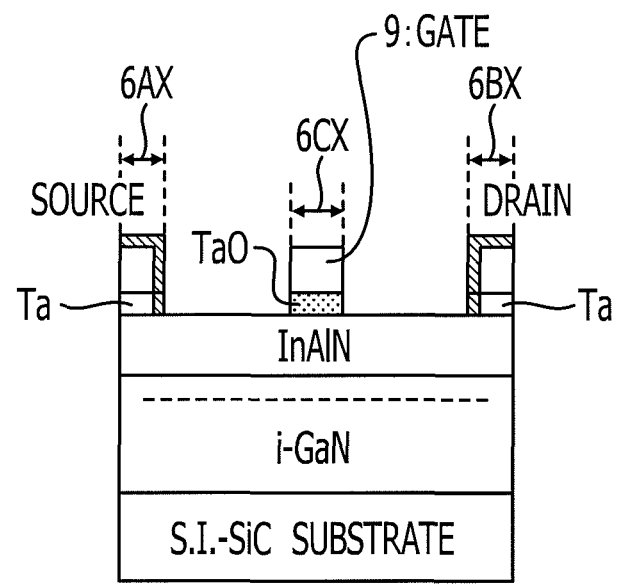

As illustrated in FIG. 6E, the gate electrode 9 formed by an Au layer with a thickness of, for example, about 500 nm, is formed over the TaO film 5CX formed in the gate electrode formation-scheduled region 6C by, for example, a photolithography technique and a deposition/lift-off technique, as in the above-described first embodiment.

Figure 6F:
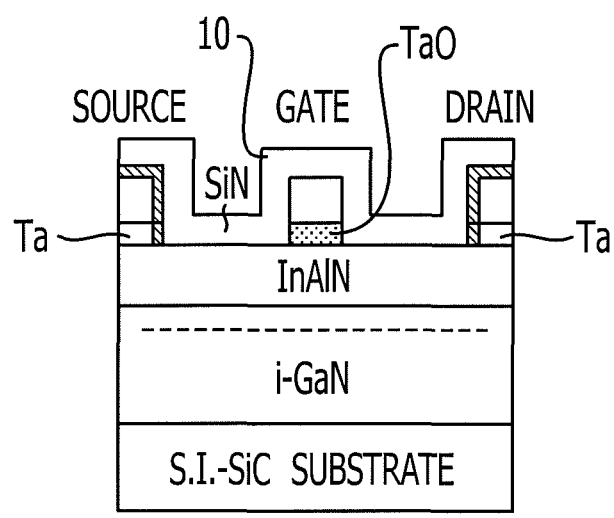

As illustrated in FIG. 6F, the passivation film (insulating film) 10 formed of, for example, SiN is formed over the entire surface, as in the above-described first embodiment.

Thus, the MIS type GaN-HEMT can be manufactured.

Since the other details of the manufacturing method are the same as those in the above-described first embodiment, the detailed description will be omitted in this embodiment.

The MIS type GaN-HEMT manufactured in the above-described method according to this embodiment has the following configuration.

As illustrated in FIG. 6F, the MIS type GaN-HEMT includes the based semiconductor lamination structure 4 including the i-GaN electron transit GaN-layer 2 and the InAlN electron supply layer 3A over the semi-insulating SiC substrate 1. That is, the MIS type GaN-HEMT includes the GaN-based semiconductor lamination structure 4 including InAlN electron supply layer 3A in the uppermost layer of the GaN-based semiconductor lamination structure 4.

Since the other details of the manufacturing method are the same as those in the above-described first embodiment, the detailed description will be omitted in this embodiment.

Accordingly, in the compound semiconductor device and the method of manufacturing the same according to this embodiment, it is possible to implement the advantage of obtaining the good semiconductor/metal interface with the absence of residue in any of the regions where of the source electrode 7, the drain electrode 8, and the gate electrode 9 are formed.

In particular, since the InAlN electron supply layer 3A is used, it is possible to implement the advantage of increasing the density of two-dimensional electron gas (2 DEG) by the strong spontaneous polarization.

This embodiment has hitherto been described as a modified example of the above-described first embodiment, but the invention is not limited thereto. For example, this embodiment may be implemented as modified examples of the above-described second to fifth embodiments.

A compound semiconductor device and a method of manufacturing the same according to a seventh embodiment will be described in reference to FIGS. 7A to 7J.

The compound semiconductor device and the method of manufacturing the same according to this embodiment are different from those according to the above-described fourth embodiment in the recess structure 13C in which the gate electrode 9 is formed. In FIGS. 7A to 7J, the same reference numerals are given to the same constituents as those in the above-described fourth embodiment.

Figure 7A:
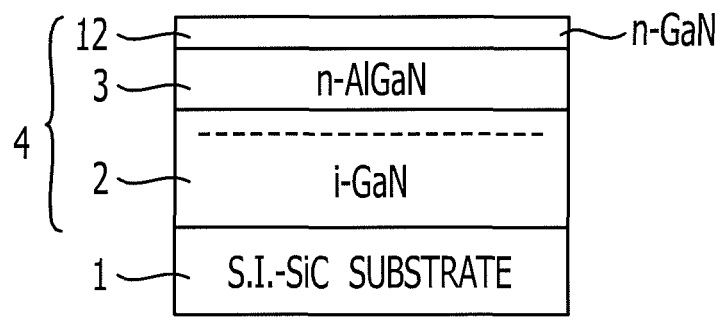
FIGS. 7A to 7J are schematic sectional views illustrating a compound semiconductor device and a method of manufacturing the same according to a seventh embodiment.

As illustrated in FIG. 7A, the i-GaN electron transit layer 2, the n-AlGaN electron supply layer 3, and the n-GaN cap layer 12 are stacked over the semi-insulating SiC substrate 1 using, for example, the MOCVD method to form the GaN-based semiconductor lamination structure 4, as in the above-described fourth embodiment.

Figure 7B:
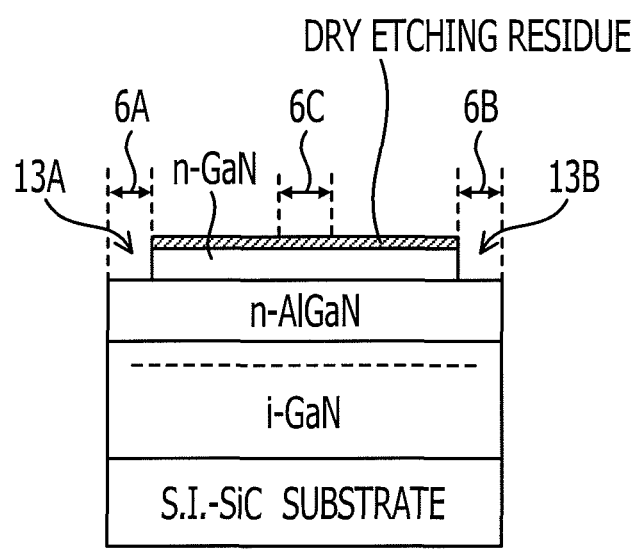

As illustrated in FIG. 7B, the GaN cap layer 12 in the source electrode formation-scheduled region 6A and the drain electrode formation-scheduled region 6B are removed by dry etching using, for example, a chlorine-based gas to form the source recess 13A and the drain recess 13B, respectively, as in the above-described fourth embodiment.

Figure 7C:
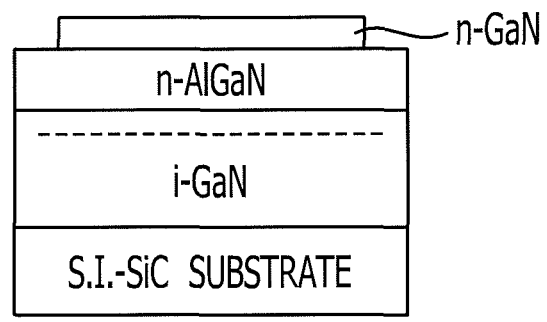

As illustrated in FIG. 7C, the surface of the GaN-based semiconductor lamination structure 4 including the recesses 13A and 13B (that is, the surfaces of the GaN cap layer 12 and the AlGaN electron supply layer 3) are cleaned using, for example, an organic solvent or acid, as in the above-described fourth embodiment.

Figure 7D:
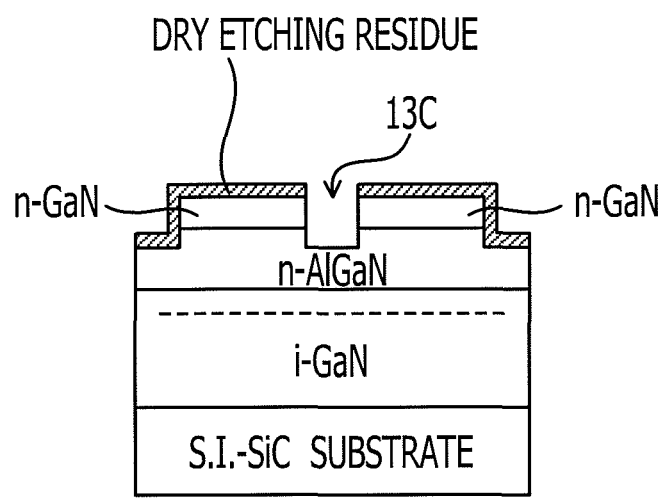

As illustrated in FIG. 7D, the gate recess 13C is formed in the gate electrode formation-scheduled region 6C.

Using, for example, a photolithography technique, the resist opening is first formed in the gate electrode formation-scheduled region 6C.

Then, using the resist with the opening, the gate recess 13C is formed by removing the entire GaN cap layer 12 in the gate electrode formation-scheduled region 6C and a part of the AlGaN electron supply layer 3 in the gate electrode formation-scheduled region 6C by dry etching using, for example, a fluorine-based gas.

The gate recess 13C is formed by removing the entire GaN cap layer 12, which is the uppermost layer of the GaN-based semiconductor lamination structure 4, and a part of the AlGaN electron supply layer 3 so that the AlGaN electron supply layer 3, which is the second layer from the surface of the GaN-based semiconductor lamination structure 4, is exposed. However, the invention is not limited thereto. For example, the gate recess 13C may be formed by removing a part of the GaN cap layer 12 so that a part of the GaN cap layer 12, which is the uppermost layer of the GaN-based semiconductor lamination structure 4, remains. For example, the gate recess 13C may also be formed by removing the entire GaN cap layer 12, which is the uppermost layer of the GaN-based semiconductor lamination structure 4, so as to expose the surface of the AlGaN electron supply layer 3, which is the second layer from the surface of the GaN-based semiconductor lamination structure 4.

Figure 7E:
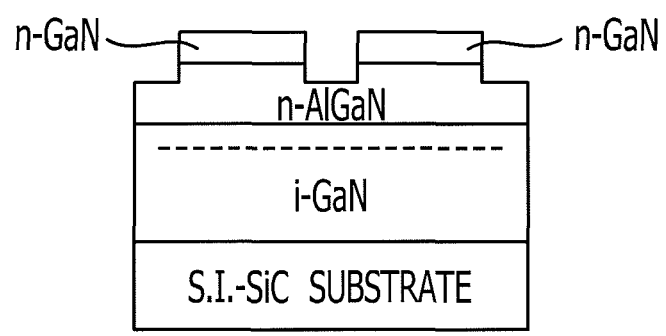

As illustrated in FIG. 7E, the surface of the GaN-based semiconductor lamination structure 4 including the source recess 13A, the drain recess 13B, and the gate recess 13C (that is, the surfaces of the GaN cap layer 12 and the AlGaN electron supply layer 3) are cleaned using, for example, an organic solvent or acid. In this embodiment, in order to remove the residue on the GaN cap layer 12 and the AlGaN electron supply layer 3 occurring in the dry etching, the AlGaN electron supply layer 3 is cleaned using, for example, a sulfuric acid hydrogen peroxide mixture (SPM).

Figure 7F:
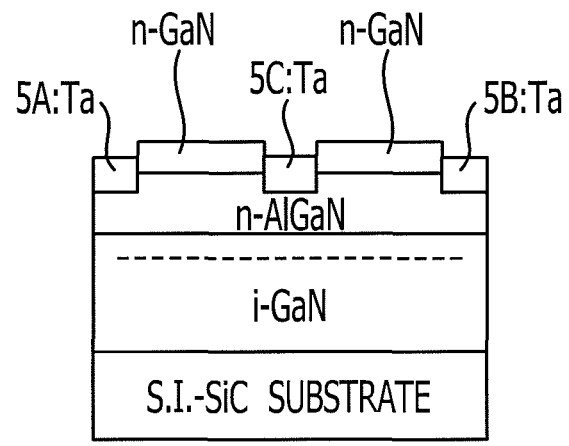

As illustrated in FIG. 7F, the Ta films (metal films) 5A to 5C with a thickness of, for example, about 20 nm, are formed over the surface of the GaN-based semiconductor lamination structure 4 by, for example, a photolithography technique and a deposition/lift-off technique, as in the above-described fourth embodiment. That is, the Ta films 5A to 5C are simultaneously formed in the source recess 13A, the drain recess 13B, and the gate recess 13C in the source electrode formation-scheduled region 6A, the drain electrode formation-scheduled region 6B, and the gate electrode formation-scheduled region 6C, respectively. Here, since the bottom surfaces of the recesses 13A to 13C formed in the source electrode formation-scheduled region 6A, the drain electrode formation-scheduled region 6B, and the gate electrode formation-scheduled region 6C are the surface of the AlGaN electron supply layer 3, which is the second layer from the surface of the GaN-based semiconductor lamination structure 4, the Ta films 5A to 5C are formed over the surface of the AlGaN electron supply layer 3.

Figure 7G:
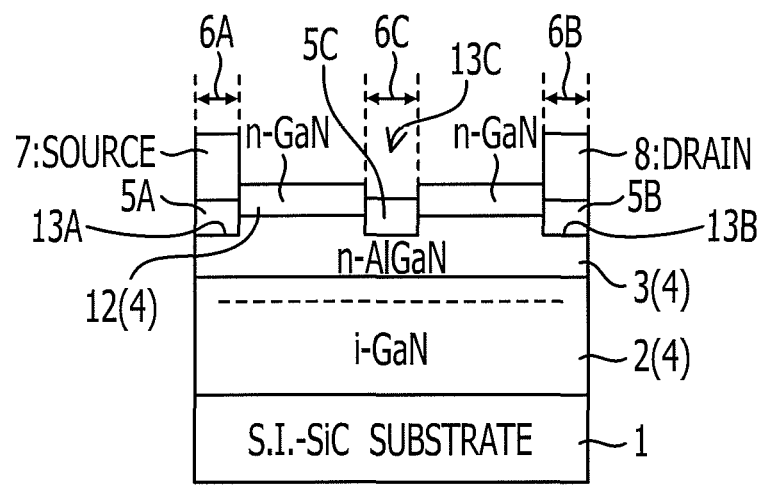

As illustrated in FIG. 7G, the source electrode 7 and the drain electrode 8 formed by the Al layer with a thickness of, about 200 nm, are formed over the Ta film 5A and the Ta film 5B formed in the source electrode formation-scheduled region 6A and the drain electrode formation-scheduled region 6B, respectively, by, for example, a photolithography technique and a deposition/lift-off technique, as in the above-described fourth embodiment.

Figure 7H:
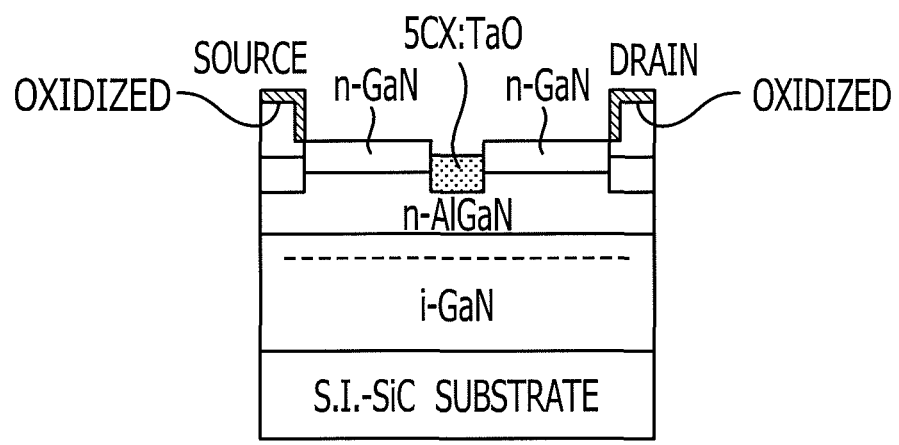

As illustrated in FIG. 7H, by performing heat treatment in an oxygen-containing atmosphere, the entire Ta film 5C of the gate electrode formation-scheduled region 6C is oxidized to form the TaO film 5CX, as in the above-described fourth embodiment. Here, the TaO film 5CX is an insulating metal oxide film and serves as a gate insulating film.

Thus, the TaO film 5CX serving as the gate insulating film is formed by oxidizing a part (here, the Ta film 5C in the gate electrode formation-scheduled region 6C) of the plurality of Ta films 5A to 5C formed over the surface of the GaN-based semiconductor lamination structure 4.

Figure 7I:
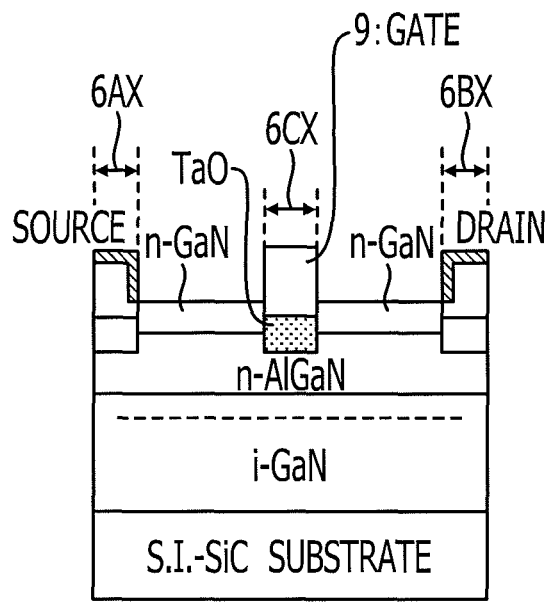

As illustrated in FIG. 7I, the gate electrode 9 formed by an Au layer with a thickness of, for example, about 500 nm, is formed over the TaO film 5CX formed in the gate electrode formation-scheduled region 6C by, for example, a photolithography technique and a deposition/lift-off technique, as in the above-described fourth embodiment.

Figure 7J:
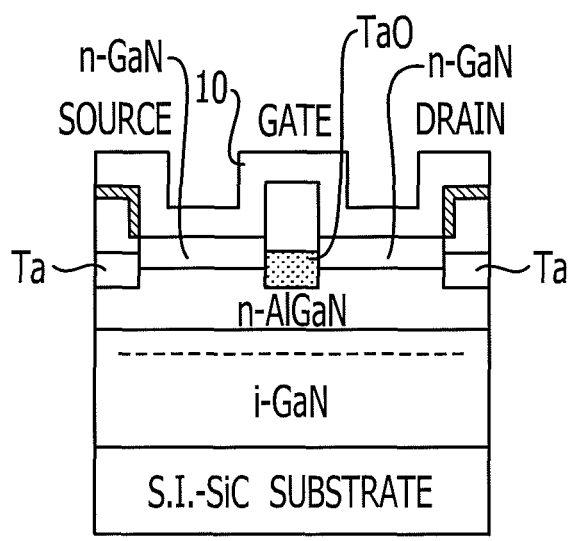

As illustrated in FIG. 7J, the passivation film (insulating film) 10 formed of, for example, SiN is formed over the entire surface, as in the above-described fourth embodiment.

Thus, the MIS type GaN-HEMT can be manufactured.

Since the other details of the manufacturing method are the same as those the above-described fourth embodiment, the detailed description will be omitted in this embodiment.

The MIS type GaN-HEMT manufactured in the above-described method according to this embodiment has the following structure.

In the MIS type GaN-HEMT, as illustrated in FIG. 7J, the gate recess 13C is formed by removing the entire GaN cap layer 12 in the gate electrode formation region 6CX and a part of the AlGaN electron supply layer 3 in the gate electrode formation region 6CX.

Since the other details of the manufacturing method are the same as those in the above-described fourth embodiment, the detailed description will be omitted in this embodiment.

Accordingly, in the compound semiconductor device and the method of manufacturing the same according to this embodiment, it is possible to implement the advantage of obtaining the good semiconductor/metal interface in the absence of residue in any of the regions where of the source electrode 7, the drain electrode 8, and the gate electrode 9 are formed.

This embodiment has hitherto been described as a modified example of the above-described fourth embodiment, but the invention is not limited thereto. For example, a combined example of the above-described second and fourth embodiments may be implemented as a modified example. Alternatively, a combined example of the above-described third and fourth embodiments may be implemented as a modified example.

The invention is not limited to the specific configuration described in each embodiment described above, but may be modified in various forms within the scope of the invention without departing from the gist of the invention.

In the above-described embodiments and the modification examples, the lowermost layers of the lamination structures formed in the source electrode formation region, the drain electrode formation region, and the gate electrode formation region (that is, the films contacting the surface of the compound semiconductor lamination structure) contain Ta, but the invention is not limited thereto. That is, in the above-described embodiments and the modification examples, the lowermost layers of the lamination structures formed in the source electrode formation region and the drain electrode formation region are the Ta films (metal films) and the lowermost layer or the passivation film of the lamination structure formed in the gate electrode formation region is the TaO film (an insulating metal oxide film: an insulating film), but the invention is not limited thereto.

For example, the lowermost layers of the lamination structures formed in the source electrode formation region and the drain electrode formation region may be any metal film among a Ta film, a Ti film, a Si film, an Al film, an Hf film, and a Zr film. The lowermost layer or the passivation film of the lamination structure formed in the gate electrode formation region may be any insulating metal oxide film or an insulating metal nitride film (insulating film) among a TaO film, a TiO film, a SiO film, a SiN film, an AlO film, an AlN film, an HfO film, and a ZrO film. Moreover, these metal films are a refractory metal film. The reason for using the refractory metal film is that heat treatment is performed to oxidize the metal film in order to form the insulating metal oxide film or the insulating metal nitride film as the gate insulating film.

The insulating metal oxide film or the insulating metal nitride film obtained by oxidizing or nitriding the metal film used in the lowermost layer of each lamination structure formed in the source electrode formation region and the drain electrode formation region may be used as the insulating film or the passivation film of the lowermost layer of the lamination structure formed in the gate electrode formation region.

The metal film used in the lowermost layer of each lamination structure formed in the source electrode formation region and the drain electrode formation region functions as a part of an ohmic electrode. Therefore, a metal film usable as an ohmic electrode and an insulating metal oxide film or an insulating metal nitride film, which is obtained by oxidation or nitration, usable as an insulating film may be used as the lowermost layer of each lamination structure formed in the source electrode formation region, the drain electrode formation region, and the gate electrode formation region (that is, the film contacting the surface of the compound semiconductor lamination structure).

Here, since the MIS type transistor is configured as an example, the insulating metal oxide film or the insulating metal nitride film described above is used, but the invention is not limited thereto. For example, when a Schottky transistor is configured, the lowermost layer of each lamination structure formed in the source electrode formation region and the drain electrode formation region may be any metal film among a Ta film, a Ti film, an Hf film, and a Zr film, and the lowermost layer or the passivation film of the lamination structure formed in the gate electrode formation region may be any metal nitride film among a TaN film, a TiN film, an HfN film, and a ZrN film.

In short, in the compound semiconductor device, the lowermost layers of the lamination structures formed in the source electrode formation region and the drain electrode formation region may be the metal film, and the lowermost layer or the passivation layer of the lamination structure formed in the gate electrode formation region may be the metal oxide film or the metal nitride film obtained by oxidizing or nitriding the metal film.

In this case, in the compound semiconductor device, the film containing the same metal element may be used as the lowermost layers of the lamination structures formed in the source electrode formation region, the drain electrode formation region, and the gate electrode formation region (that is, the films contacting the surface of the compound semiconductor lamination structure).

For example, the compound semiconductor lamination structure of the compound semiconductor device according to each embodiment and each modified example described above is not limited to the specific example of the compound semiconductor lamination structure according to each embodiment and each modified example described above. Instead, another compound semiconductor lamination structure may be used. For example, a compound semiconductor lamination structure in which the MIS type transistor with a gate insulating film is configured may be used. Alternatively, a compound semiconductor lamination structure in which a field-effect transistor (such as, a field-effect transistor using a nitride semiconductor) is configured may be used. The compound semiconductor lamination structure is also referred to as an epitaxial structure.

For example, the SiC substrate is used in each embodiment and each modified example described above, but the invention is not limited thereto. For example, another substrate such as a semiconductor substrate (such as, a sapphire substrate, a Si substrate or a GaAs substrate) may be used. The semi-insulating substrate is used in each embodiment and each modified example described above, but the invention is not limited thereto. For example, an n-type conductive substrate or a p-type conductive substrate may be used.

For example, the layer structure of the source electrode, the drain electrode, and the gate electrode according to each embodiment and each modified example described above is not limited to the specific example of the layer structure of the source electrode, the drain electrode, and the gate electrode according to each embodiment and each modified example described above, but another layer structure may be used. For example, the layer structure of the source electrode, the drain electrode, and the gate electrode according to each embodiment and each modified example described above may be a single-layered structure or a multi-layered structure. The method of forming the source electrode, the drain electrode, and the gate electrode according to each embodiment and each modified example described above is just an example. The source electrode, the drain electrode, and the gate electrode may be formed according to any method.

For example, in each embodiment and each modified example described above, the ohmic characteristics of the source electrode and the drain electrode are ensured by the heat treatment of oxidizing the Ta film, but the invention is not limited thereto. Instead, heat treatment necessary for oxidizing the Ta film may be performed, as long as the ohmic characteristics can be obtained even though the heat treatment is not performed. That is, no heat treatment may be performed to obtain the ohmic characteristics of the source electrode and the drain electrode. In each embodiment and each modified example described above, heat treatment is not performed on the gate electrode. However, heat treatment may be performed on the gate electrode.

All examples and conditional language recited herein are intended for pedagogical purposes to aid the reader in understanding the invention and the concepts contributed by the inventor to furthering the art, and are to be construed as being without limitation to such specifically recited examples and conditions. Although the embodiments in accordance with aspects of the present inventions have been described in detail, it should be understood that various changes, substitutions, and alterations could be made hereto without departing from the spirit and scope of the invention.

What is claimed is:

1. A method of manufacturing a compound semiconductor device, comprising:
    forming a compound semiconductor lamination structure over an entire surface of a substrate;
    forming a metal film over the compound semiconductor lamination structure;
    forming a source electrode and a drain electrode over the metal film;
    forming one of a metal oxide film and a metal nitride film by one of oxidizing and nitriding a part of the metal film; and
    forming a gate electrode over the metal oxide film or the metal nitride film.

2. The method according to claim 1, further comprising:
forming a passivation film that covers a surface of the compound semiconductor lamination structure after the gate electrode is formed,
wherein in the forming of the metal film, the metal film is simultaneously formed in a source electrode formation-scheduled region, a drain electrode formation-scheduled region, and a gate electrode formation-scheduled region, respectively, over the surface of the compound semiconductor lamination structure.

3. The method according to claim 1, further comprising:
forming a passivation film covering a surface of the compound semiconductor lamination structure before the metal oxide film or the metal nitride film is formed,
wherein in the forming of the metal film, the metal film is simultaneously formed in a source electrode formation-scheduled region, a drain electrode formation-scheduled region, and a gate electrode formation-scheduled region, respectively, over the surface of the compound semiconductor lamination structure.

4. The method according to claim 1, wherein in the forming of the metal film, the metal film is simultaneously formed over a surface of the compound semiconductor lamination structure.

5. The method according to claim 1, further comprising:
forming a recess by removing a part of the compound semiconductor lamination structure in a gate electrode formation-scheduled region, before the metal film is formed.

6. The method according to claim 1, further comprising:
forming recesses by removing at least an uppermost compound semiconductor layer of the compound semiconductor lamination structure in each of a source electrode formation-scheduled region and a drain electrode formation-scheduled region, before the metal film is formed,
wherein in the forming of the metal film, the metal film is formed in a gate electrode formation-scheduled region over a surface of the uppermost compound semiconductor layer and, simultaneously, the metal layer is formed in the recesses, respectively.

7. The method according to claim 1, further comprising:
forming recesses by removing at least an uppermost compound semiconductor layer of the compound semiconductor lamination structure in each of a source electrode formation-scheduled region, a drain electrode formation-scheduled region, and a gate electrode formation-scheduled region, before the metal film is formed,
wherein in the forming of the metal film, the metal film is formed in the recesses, respectively.

8. The method according to claim 1, wherein the metal film is a refractory metal film.

9. The method according to claim 1, wherein the metal film contains one of Ta, Ti, Si, Al, Hf, and Zr.

10. The method according to claim 1, wherein the thickness of the metal film is in the range of between 5 nm and 100 nm.

11. The method according to claim 1, wherein the compound semiconductor lamination structure is a nitride semiconductor lamination structure.

12. the method according to claim 1, wherein the compound semiconductor lamination structure includes a carrier transit layer and a carrier supply layer.

13. The method according to claim 1, wherein the compound semiconductor lamination structure includes an AlGaN electron supply layer.

14. The method according to claim 1, wherein the compound semiconductor lamination structure includes an AlGaN electron supply layer in an uppermost layer.

15. The method according to claim 1, wherein the compound semiconductor lamination structure includes a GaN cap layer and an AlGaN electron supply layer.

16. The method according to claim 1, wherein the compound semiconductor lamination structure includes an InAlN electron supply layer.

17. The method according to claim 1, wherein the compound semiconductor lamination structure includes an InAlN electron supply layer in an uppermost layer.

18. The method according to claim 1, wherein the compound semiconductor lamination structure includes a GaN cap layer and an InAlN electron supply layer.

* * * * *

UNITED STATES PATENT AND TRADEMARK OFFICE
CERTIFICATE OF CORRECTION

| | | |
|---|---|---|
| PATENT NO. | : 8,598,571 B2 | Page 1 of 1 |
| APPLICATION NO. | : 13/008353 | |
| DATED | : December 3, 2013 | |
| INVENTOR(S) | : Toshihiro Ohki | |

It is certified that error appears in the above-identified patent and that said Letters Patent is hereby corrected as shown below:

On the Title Page: Item 30

Please correct the following to Foreign Application Priority Data:

Mar. 9, 2010   (JP) ........................................ 2010-52105

Signed and Sealed this
Twenty-fifth Day of February, 2014

Michelle K. Lee
*Deputy Director of the United States Patent and Trademark Office*